United States Patent
Muramatsu et al.

(10) Patent No.: US 11,631,581 B2
(45) Date of Patent: Apr. 18, 2023

(54) INSULATING FILM FORMING METHOD, INSULATING FILM FORMING DEVICE, AND SUBSTRATE PROCESSING SYSTEM

(71) Applicant: TOKYO ELECTRON LIMITED, Tokyo (JP)

(72) Inventors: Makoto Muramatsu, Kumamoto (JP); Yusuke Saito, Kumamoto (JP); Hisashi Genjima, Kumamoto (JP); Hiroyuki Fujii, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/604,744

(22) PCT Filed: Mar. 13, 2018

(86) PCT No.: PCT/JP2018/009752
§ 371 (c)(1),
(2) Date: Oct. 11, 2019

(87) PCT Pub. No.: WO2018/193753
PCT Pub. Date: Oct. 25, 2018

(65) Prior Publication Data
US 2020/0211838 A1 Jul. 2, 2020

(30) Foreign Application Priority Data
Apr. 17, 2017 (JP) .............................. JP2017-081595

(51) Int. Cl.
*H01L 21/324* (2006.01)
*H01L 21/02* (2006.01)
*B05D 3/06* (2006.01)

(52) U.S. Cl.
CPC ........ *H01L 21/02164* (2013.01); *B05D 3/067* (2013.01); *H01L 21/02282* (2013.01); *H01L 21/02348* (2013.01); *H01L 21/324* (2013.01)

(58) Field of Classification Search
CPC ............. H01L 21/316; H01L 21/02164; H01L 21/02282; H01L 21/324; H01L 21/2348;
(Continued)

(56) References Cited

U.S. PATENT DOCUMENTS

| | | | | |
|---|---|---|---|---|
| 5,747,623 A | * | 5/1998 | Matsuo | ................. C03C 17/007 525/474 |
| 9,847,245 B1 | * | 12/2017 | Kittl | .................. H01L 21/76224 |

(Continued)

FOREIGN PATENT DOCUMENTS

| | | | | |
|---|---|---|---|---|
| CN | 105378895 A | * | 6/2014 | ............ H01L 21/22 |
| CN | 105378895 A | | 3/2016 | |

(Continued)

OTHER PUBLICATIONS

Translation of CN 105378895 (Jun. 30, 2014) Toray Industries (Iababa Sachio et al.). (Year: 2014).*

*Primary Examiner* — Caridad Everhart
(74) *Attorney, Agent, or Firm* — Nath, Goldberg & Meyer; Jerald L. Meyer; Tanya E. Harkins

(57) ABSTRACT

A technique for obtaining good film quality in forming a silicon-oxide-containing insulating film as a coating film on a substrate. A coating liquid containing polysilazane is applied to a wafer, a solvent in the coating liquid is volatilized, and then the coating film is irradiated with ultraviolet rays under a nitrogen atmosphere before performing a curing process. Thus, dangling bonds are likely to be formed at hydrolyzed portions in polysilazane. Since dangling bonds are formed in advance at portions in silicon to be hydrolyzed, productivity of hydroxyl groups is enhanced. That is, since an energy required for hydrolysis is reduced, the (Continued)

number of the portions remaining without being hydrolyzed is reduced even when the curing process is performed at a low temperature. Therefore, dehydration synthesis occurs efficiently, which increases a crosslinking rate and makes it possible to form a dense (good film quality) insulating film.

14 Claims, 19 Drawing Sheets

(58) Field of Classification Search
CPC ......... H01L 21/76224; H01L 21/31111; H01L 21/02222; H01L 21/031111; H01L 21/0214; H01L 21/67772; H01L 21/67742; H01L 21/762
See application file for complete search history.

(56) References Cited

U.S. PATENT DOCUMENTS

| | | | |
|---|---|---|---|
| 11,315,784 B2* | 4/2022 | Muramatsu | H01L 21/02348 |
| 2007/0098901 A1* | 5/2007 | Terada | H01L 21/02337 |
| | | | 427/335 |
| 2009/0246917 A1* | 10/2009 | Zarbock | H01L 21/563 |
| | | | 29/25.01 |
| 2011/0212620 A1* | 9/2011 | Liang | H01L 21/316 |
| | | | 438/692 |
| 2012/0164382 A1* | 6/2012 | Yun | C09D 183/16 |
| | | | 524/588 |
| 2015/0132587 A1* | 5/2015 | Nishio | C23C 14/081 |
| | | | 428/447 |
| 2015/0329970 A1* | 11/2015 | Khan | H01L 21/67778 |
| | | | 118/719 |
| 2016/0108282 A1* | 4/2016 | Ito | C09D 183/14 |
| | | | 428/446 |
| 2018/0201807 A1* | 7/2018 | Fujii | H01L 21/02326 |

FOREIGN PATENT DOCUMENTS

| | | |
|---|---|---|
| JP | 2012174717 A | 9/2012 |
| JP | 2014151571 A | 8/2014 |
| WO | 2014104295 A1 | 7/2014 |

\* cited by examiner

Hydrolysis

Dehydration synthesis

FIG. 9
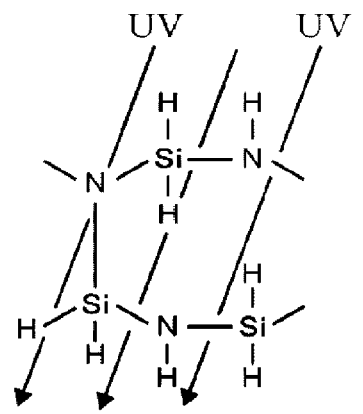
Forming dangling bonds
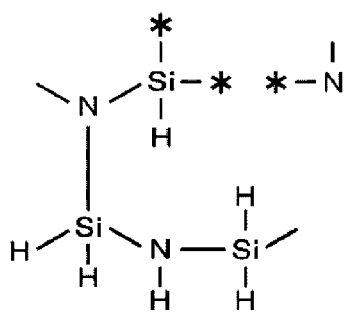
Forming hydroxyl group
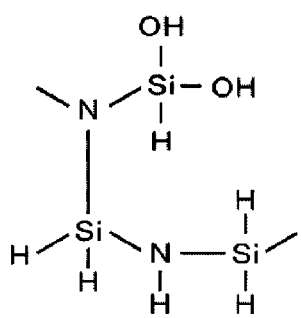

INSULATING FILM FORMING METHOD, INSULATING FILM FORMING DEVICE, AND SUBSTRATE PROCESSING SYSTEM

CROSS-REFERENCE TO RELATED APPLICATIONS

This is a National Phase Application under 35 U.S.C. 371 as a national stage of PCT/JP2018/009752, filed Mar. 13, 2018, an application claiming the benefit of priority from Japanese Patent Application No. 2017-081595, filed on Apr. 17, 2017, the entire contents of which are incorporated herein by reference.

TECHNICAL FIELD

The present disclosure relates to a technique for forming an insulating film, which is a coating film containing silicon oxide and is cured by a crosslinking reaction, on a substrate.

BACKGROUND

A semiconductor device manufacturing process includes a step of forming an insulating film such as a silicon oxide film. The insulating film is formed through, for example, a plasma CVD method or application of a coating liquid. The insulating film formed through the plasma CVD method is dense and good in film quality, but is poor in embeddability. Thus, the plasma CVD method is not suitable for embedding an insulator in a narrow trench called shallow trench isolation (STI), and, for example, it is necessary to repeatedly perform the plasma CVD method and an etch back method such that the insulator is gradually embedded without generating a clearance. Therefore, a film forming process becomes complicated or a large-scale apparatus is required in order to perform a vacuum process.

On the other hand, an insulating film formed by, for example, applying a coating liquid to a semiconductor wafer (hereinafter referred to as a "wafer") by a spin coating method and curing a coating film is good in embeddability. Thus, the insulating film can easily fill even a narrow pattern such as STI. Further, the insulating can be formed in a normal pressure atmosphere. However, there is a problem in that the insulating film has a relatively low strength. Therefore, the coating film is heat-treated (cured), for example, at 600 degrees C. to 800 degrees C. to increase the strength of the film.

However, with a miniaturization of patterns, there is a demand for keeping a thermal history of a manufactured semiconductor device as low as possible. Thus, in the case of forming, for example, an interlayer insulating film, a temperature cannot be increased to be higher than 450 degrees C. from the viewpoint of migration of a copper (Cu) wiring, diffusion of Cu, and the like. Therefore, the method of forming an insulating film by applying a coating liquid is not applicable to an interlayer insulating film due to a high curing temperature.

Patent Document 1 discloses a technique for forming an insulating film by applying a coating film, heating the coating film at a low temperature, and then performing a high-temperature treatment in a vapor atmosphere. However, such a technique does not solve a problem to be solved by the present disclosure.

PRIOR ART DOCUMENT

[Patent Document]
Patent Document 1: Japanese laid-open publication No. 2012-174717

The present disclosure has been made in view of the foregoing, and an object thereof is to provide a technique capable of obtaining a good film quality when forming a silicon-oxide-containing insulating film as a coating film on a substrate.

SUMMARY

An insulating film forming method of the present disclosure includes: a process of forming a coating film by applying a coating liquid, which is obtained by dissolving precursors for forming a silicon-oxide-containing insulating film, to a substrate;

a solvent volatilization process of volatilizing a solvent in the coating film;

an energy supply process of supplying, after the solvent volatilization process, an energy to the coating film under a low oxygen atmosphere having an oxygen concentration lower than that of atmospheric atmosphere, such that dangling bonds are formed in molecular groups constituting the precursors; and subsequently, a curing process of heating the substrate such that the precursors are crosslinked to form the insulating film.

An insulating film forming device of the present disclosure includes: a coating module configured to form a coating film by applying a coating liquid, which is obtained by dissolving precursors for forming a silicon-oxide-containing insulating film, to a substrate;

a solvent volatilization module configured to volatilize a solvent in the coating film;

an energy supply module configured to supply an energy to the coating film, from which the solvent has been volatilized, under a low oxygen atmosphere having an oxygen concentration lower than that of atmospheric atmosphere, such that the precursors are activated; and a curing module configured to heat the substrate after being processed in the energy supply module such that the precursors are crosslinked to form the insulating film; and a substrate transfer mechanism configured to transfer among the respective modules.

A substrate processing system of the present disclosure includes: a substrate processing device including: a loading and unloading port through which a substrate accommodated in a transfer container is loaded and unloaded; a coating module configured to form a coating film by applying a coating liquid, which is obtained by dissolving precursors for forming a silicon-oxide-containing insulating film, to a substrate; a solvent volatilization module configured to volatilize a solvent in the coating film; an energy supply module configured to supply an energy to the coating film, from which the solvent has been volatilized, under a low oxygen atmosphere having an oxygen concentration lower than that of atmospheric atmosphere, such that the precursors are activated; and a substrate transfer mechanism configured to transfer the substrate among the respective modules and the loading and unloading port;

a curing device configured to heat the substrate after being processed in the energy supply module such that the precursors are crosslinked to form the insulating film; and a container transfer mechanism configured to transfer the transfer container between the loading and unloading port of the substrate processing device and the curing device.

According to the present disclosure, a coating liquid containing precursors of a silicon-oxide-containing insulating film is applied to a substrate, a solvent of the coating liquid is volatilized, and then an energy is supplied to the coating film under a low oxygen atmosphere before performing a curing process. Thus, dangling bonds are likely to be formed in hydrolyzed portions in the precursors. In the curing process, hydroxyl groups are first bonded to silicon of molecular groups constituting the precursors by hydrolysis, and then the hydroxyl groups of the molecular groups are dehydrated and condensed so as to cause crosslinking. Since dangling bonds are formed in advance at portions in the silicon to be hydrolyzed, the productivity of hydroxyl groups is enhanced. That is, since the energy required for hydrolysis is reduced, the number of the portions remaining without being hydrolyzed is reduced even when the curing process is performed at a low temperature. Therefore, dehydration synthesis occurs efficiently, which increases a cross-linking rate and makes it possible to form a dense (good film quality) insulating film.

BRIEF DESCRIPTION OF DRAWINGS

FIG. 9 is an explanatory view for explaining a reaction path of polysilazane according to a film forming method of the present disclosure.

DETAILED DESCRIPTION

[Outline of Disclosure]

Before describing details of embodiments of the present disclosure, an outline of the present disclosure will be explained. An example of a method for forming an insulating film according to the present disclosure may include processes of applying a coating liquid containing a precursor of a silicon-oxide-containing insulating film to a substrate, heating an obtained coating film to volatilize a solvent in the coating film, heating the substrate to rearrange molecular groups in the coating film, irradiating the coating film with an ultraviolet light, and then curing the coating film.

Figure 1:
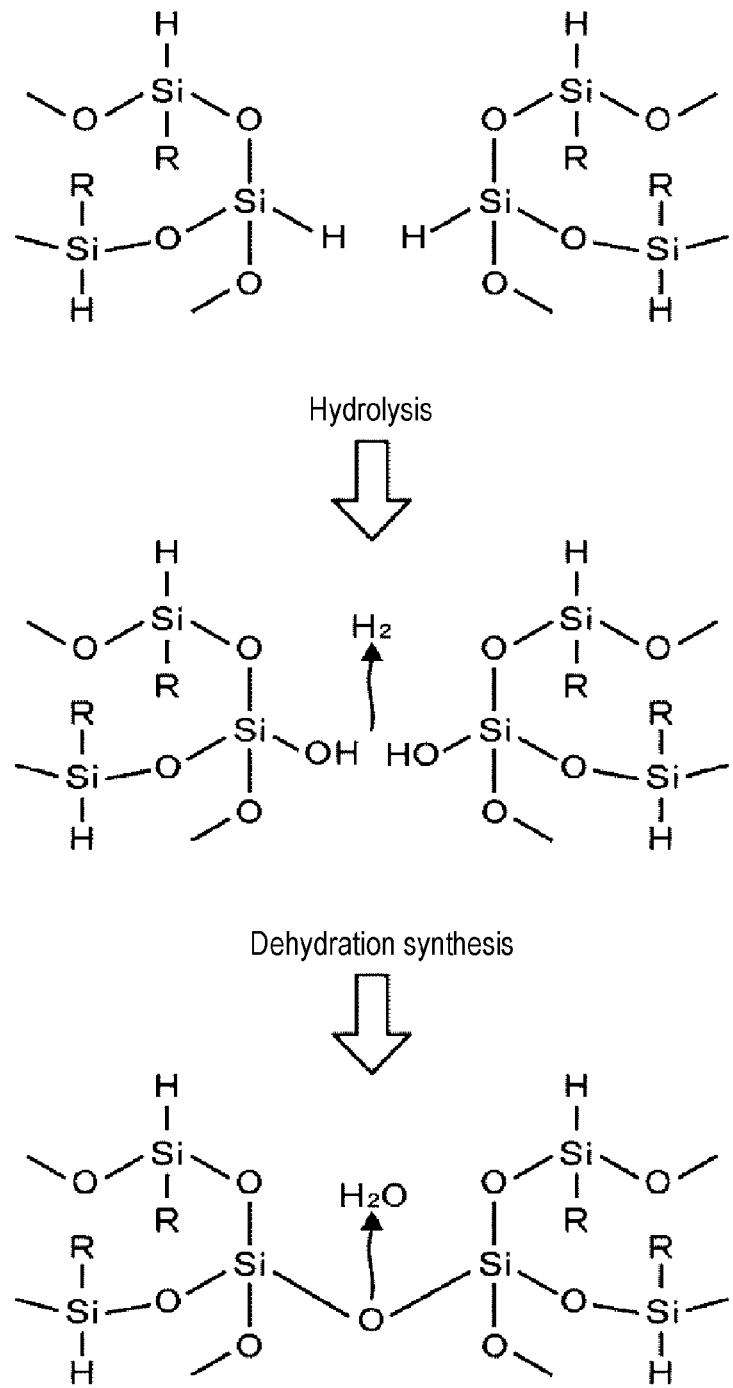
FIG. 1 is an explanatory view for explaining a conventional insulating film curing process.

The coating liquid is manufactured by dissolving a group of oligomers, which are molecular groups of the precursor of the silicon-oxide-containing insulating film, in a solution as a solvent. In a conventional curing process, a substrate is heated to, for example, 500 degrees C. which causes hydrolysis (reaction) of Si—H bonds in oligomers with $H_2O$ (moisture) to form Si—OH bonds as illustrated in FIG. 1, and subsequently, dehydration synthesis (reaction) occurs to form a Si—O—Si bond, crosslinking the oligomers.

The reason why oligomers are used as components of a coating liquid is that precursors do not dissolve in a solution if all of the precursors are linked. Thus, a state oligomers, i.e., a state of the above-described precursors, before the hydrolysis is stabilized, and it is difficult to promote the hydrolysis because the hydrolysis is a state transition process from a stabilized state to an unstable state. Therefore, it is necessary to increase the curing temperature or to cause the reaction to be performed for a long time at a low temperature.

Meanwhile, the dehydration synthesis reaction proceeds rapidly only by applying heat energy. Thus, when the curing temperature is increased to accelerate the hydrolysis, the dehydration synthesis (in which the Si—OH bonds are turned into the Si—O—Si bond) occurs more easily than the hydrolysis (in which the Si—H bonds are turned into the Si—OH bonds), reducing a denseness of the insulating film. Roughly speaking, it is presumed that this is because, when some oligomers are cross-linked with one another by the dehydration synthesis, the remaining oligomers may not be hydrolyzed yet and may be introduced into cross-linked products of some oligomers. In addition, the method of performing the curing process at low temperature for a long time is not acceptable in a production line because throughput is degraded.

Figure 2:
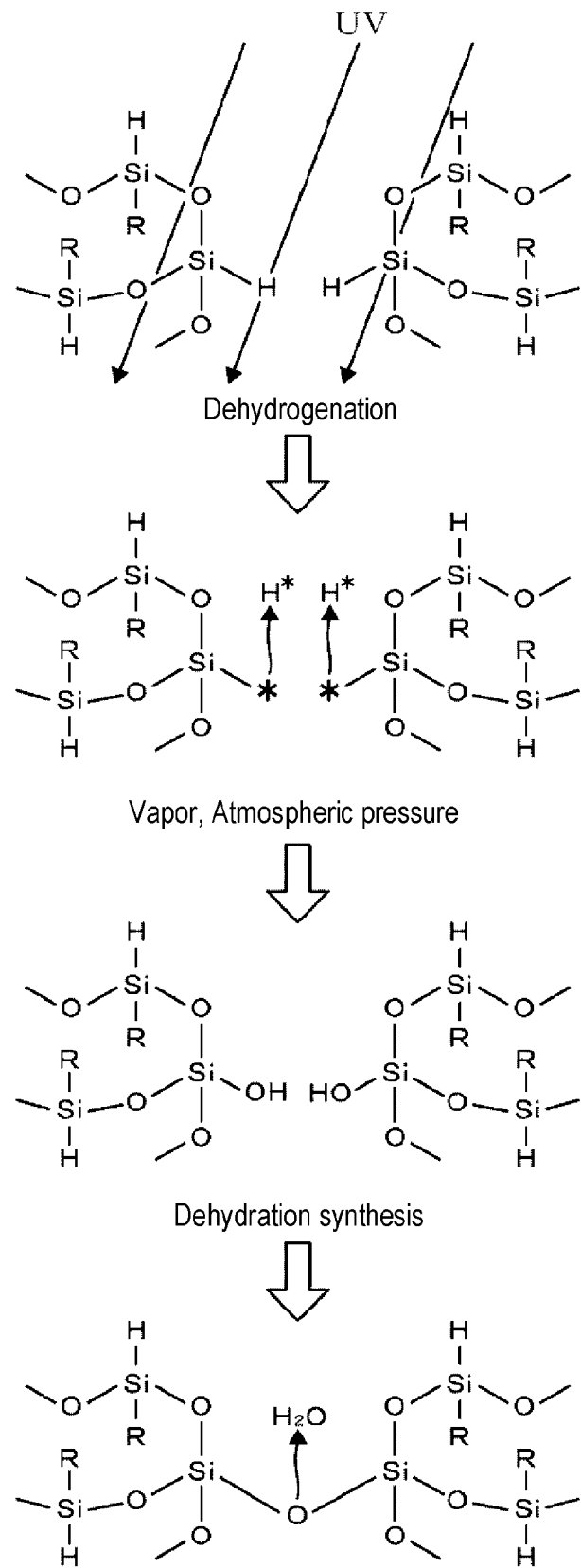
FIG. 2 is an explanatory view for explaining an insulating film curing process of the present disclosure.

Therefore, in the present disclosure, for example, ultraviolet rays are irradiated to a coating film before performing a curing process so as to form dangling bonds at portions where hydrolysis occurs (in other words, to activate oligomers). That is to say, as illustrated in FIG. 2, by an energy of ultraviolet rays, Si—H bonds in the oligomers are broken and dangling bonds are formed. This reduces an energy required for hydrolysis in the curing process. Thus, productivity of hydroxyl groups (OH groups) is increased, and a crosslinking rate by subsequent dehydration synthesis is improved. Accordingly, a dense (good film quality) insulating film is obtained even when the curing process is performed at a low temperature.

It is necessary to carry out the irradiation of the ultraviolet rays to the coating film before the curing process for the following reason. Even when performed at a low temperature, the curing process is carried out in a heated atmosphere of, for example, 350 degrees C. to 450 degrees C. Thus, when the dangling bonds are formed by the energy of the ultraviolet rays as described above, crosslinking occurs from the portions where the dangling bonds are formed. Accordingly, the oligomers in which the Si—H bonds have not been cleaved are confined in crosslinked oligomer groups, which may cause reduction in denseness of the insulating film.

For the reason described above, the process of irradiating the coating film with the ultraviolet rays needs to be performed at a temperature at which the above-described phenomenon is suppressed. Specifically, the temperature may be, for example, 350 degrees C. or less, and the process may be performed, for example, at room temperature. In addition, the process of irradiating the coating film with the ultraviolet rays needs to be performed in a low oxygen concentration atmosphere, which is lower in oxygen concentration than atmospheric atmosphere, and maybe performed, for example, in an atmosphere with an oxygen concentration of 400 ppm or less, preferably 50 ppm or less. The low oxygen concentration atmosphere is, for example, an atmosphere of an inert gas such as a nitrogen gas.

When the oxygen concentration is high in the atmosphere in which the irradiation process is performed, oligomers having dangling bonds formed by the irradiation of the ultraviolet rays are instantaneously bonded to one another, and isolated oligomers are confined in the bonded oligomers. As a result, the denseness of the insulating film is reduced.

[Embodiment]

Figure 3:
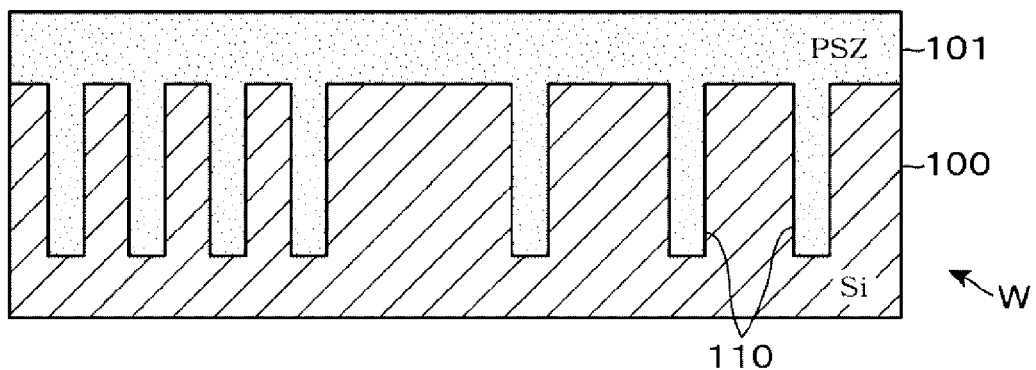
FIG. 3 is an explanatory view for explaining an insulating film forming process according to an embodiment of the present disclosure.

Next, an embodiment of the film forming method of the present disclosure will be described in detail. In this example, a process of performing STI with respect to a target substrate will be described. As illustrated in FIG. 3, a wafer W as the target substrate includes grooves (trenches) 110 formed in a silicon film 100, and a coating film 101 is formed to fill the trenches 110 by applying a coating liquid obtained by dissolving a precursor of an SOG film in an organic solution to the wafer W. As the precursor, for example, polysilazane, which is a polymer having —(SiH$_2$NH)— as a basic structure, is used. In the coating liquid, polysilazane molecular groups are dissolved in a state of oligomers so as to improve fluidity. Therefore, when the coating liquid is applied to the wafer W by, for example, a spin coating method, the coating liquid easily enters the narrow trenches 110, and the coating film 101 having good embeddability is obtained, as illustrated in FIG. 3. In FIGS. 3 to 10, "PSZ" (polysilazane) is denoted in the coating film 101.

Figure 4:
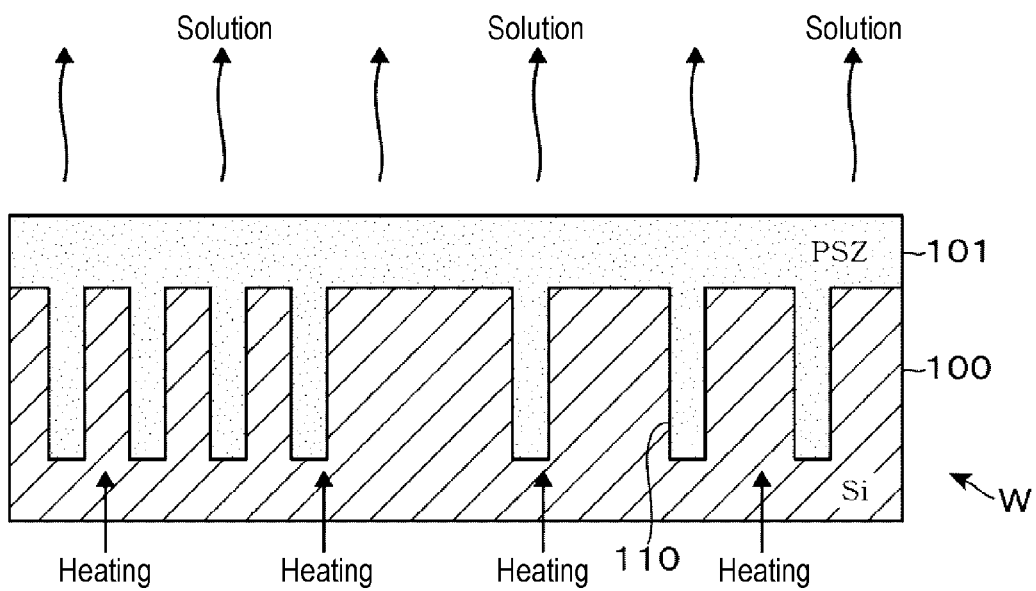
FIG. 4 is an explanatory view for explaining the insulating film forming process according to the embodiment of the present disclosure.
Figure 5:
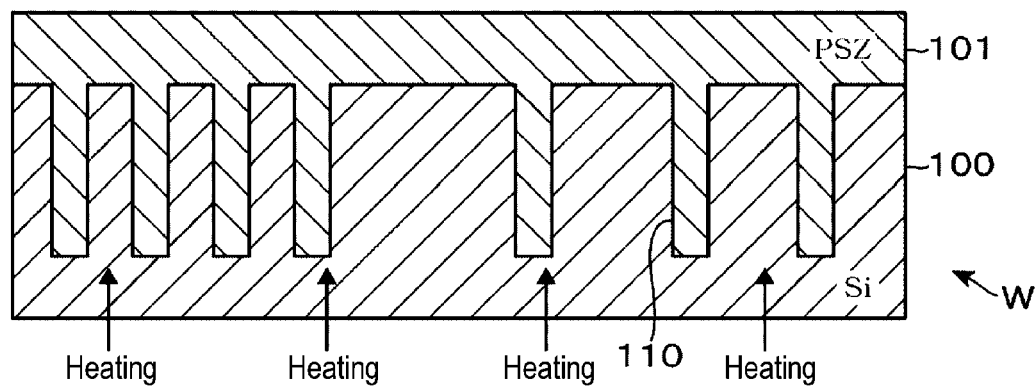
FIG. 5 is an explanatory view for explaining the insulating film forming process according to the embodiment of the present disclosure.

Subsequently, as illustrated in FIG. 4, the wafer W is heated at a temperature ranging from 100 to 250 degrees C., for example, at 150 degrees C., for three minutes. Thus, the solution, which is a solvent contained in the coating film 101, is volatilized. Next, as illustrated in FIG. 5, the wafer W is heated at a temperature ranging from 200 to 300 degrees C., for example, at 250 degrees C. At this time, the oligomers contained in the coating film 101 are activated by heat. Therefore, the oligomers in the coating film 101 are rearranged and aligned so as to fill gaps between the oligomers (a reflow process). By performing the reflow process to rearrange the oligomers, the gaps between the oligomers are narrowed. Therefore, when crosslinks between the oligomers are formed by a subsequent curing process, a dense film is easily formed.

Figure 6:
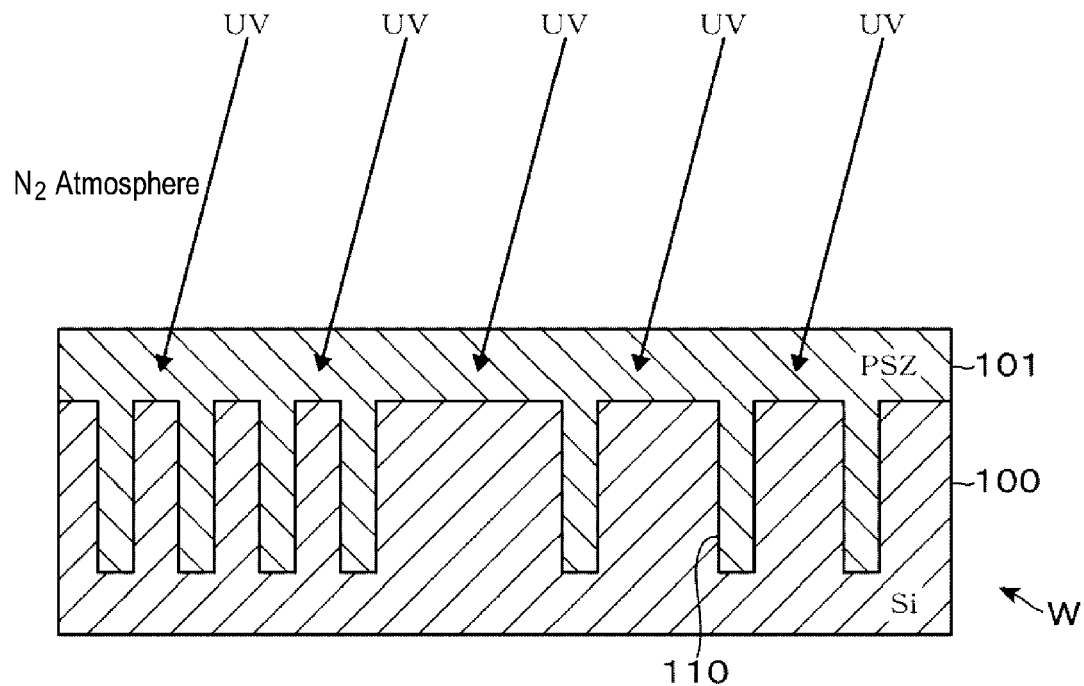
FIG. 6 is an explanatory view for explaining an insulating film forming process according to the embodiment of the present disclosure.
Figure 7:
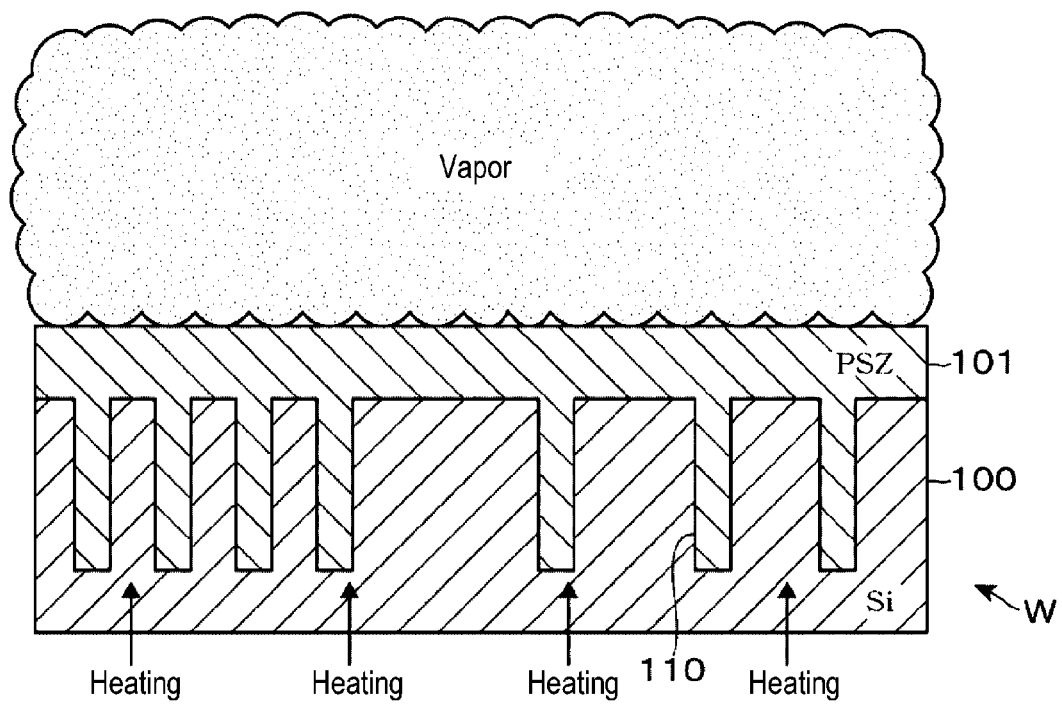
FIG. 7 is an explanatory view for explaining an insulating film forming process according to the embodiment of the present disclosure.

Thereafter, as illustrated in FIG. 6, in an atmosphere (e.g., a nitrogen (N$_2$) gas atmosphere) with an oxygen concentration of 400 ppm or less, preferably 50 ppm or less, the coating film 101 is irradiated with an energy of 5,000 mJ/cm$^2$ or less, for example, 4,000 mJ/cm$^2$. As the energy, for example, ultraviolet (UV) rays having a main wavelength of 200 nm or less, for example, ultraviolet rays having a main wavelength of 172 nm is irradiated. The main wavelength refers to a wavelength corresponding to the maximum peak in a spectrum or the vicinity of the maximum peak. In the subsequent curing process, as illustrated in FIG. 7, while supplying vapor toward the wafer W, a stepwise heat treatment are performed at temperatures ranging from 350 degrees C. to 450 degrees C. For example, the wafer W is stepwise heated at 400 degrees C. and 450 degrees C. under a vapor atmosphere, and is further heated at 450 degrees under a N$_2$ gas atmosphere.

Figure 8:
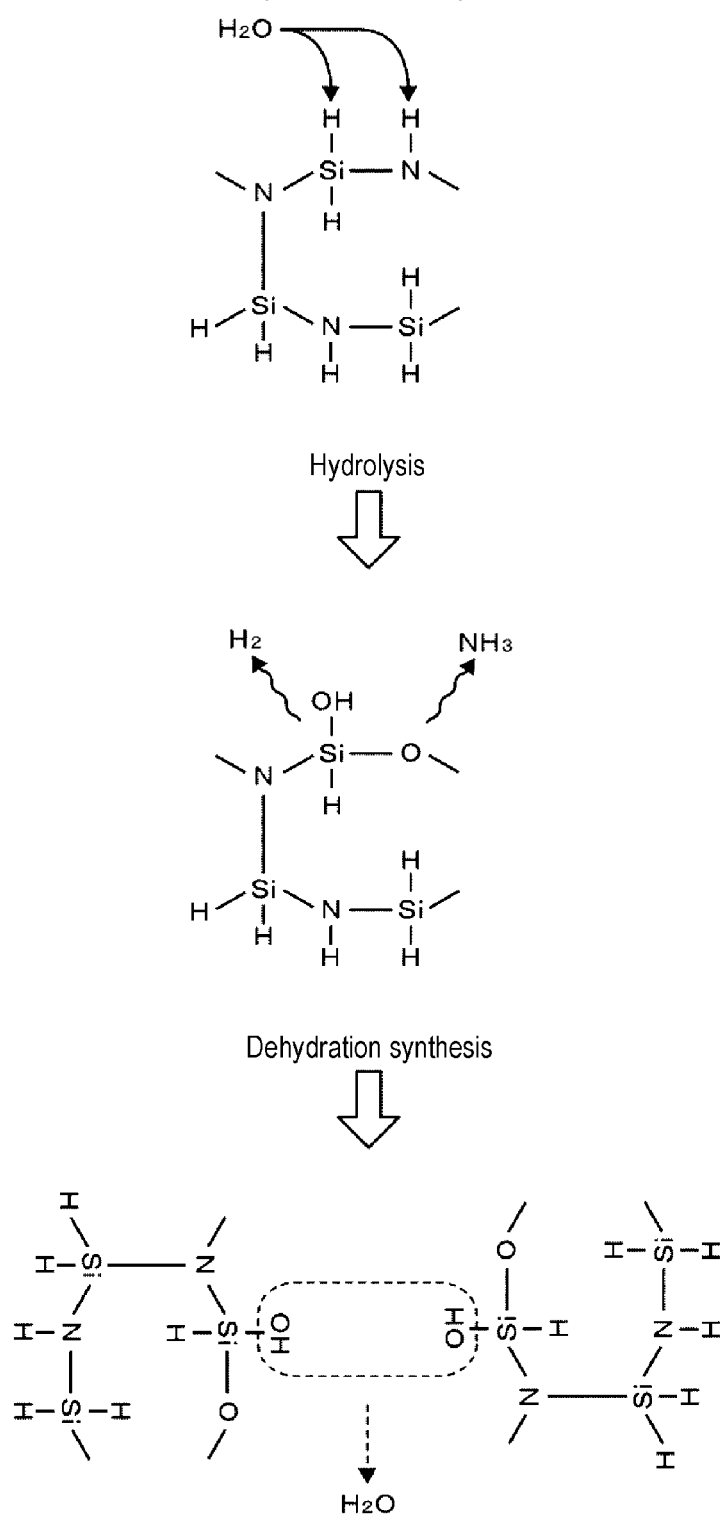
FIG. 8 is an explanatory view for explaining a reaction path of polysilazane in a conventional film forming process.

FIG. 8 illustrates a reaction path when a curing process is performed on polysilazane without irradiating the polysilazane with ultraviolet rays, and FIG. 9 illustrates a reaction path when performing a curing process on polysilazane irradiated with ultraviolet rays. As illustrated in FIG. 8, when the curing process is performed on the polysilazane, H bonded to Si becomes an OH group by hydrolysis, and a N—H group is oxidized to form ammonia (NH$_3$), whereby a Si—O bond is formed. Then, OH groups form a crosslink by dehydration synthesis. However, as described in the outline of the present disclosure, when the curing process is performed, the hydrolysis is difficult to occur and the film becomes less dense.

On the other hand, by irradiating the coating film 101 containing polysilazane with ultraviolet rays before the curing process, as illustrated in FIG. 9, some Si—H bonds are broken to form dangling bonds and some Si—N bonds are broken to form dangling bonds. As a result, when the curing process is performed, OH groups are easily bonded to the dangling bonds to form Si—OH bonds. Further, OH groups are crosslinked by dehydration synthesis to form Si—O—Si bonds. Furthermore, Si—N bonds in the polysilazane are replaced by O to form silicon oxide. As described above, by forming dangling bonds in advance, the productivity of OH groups is increased and the crosslinking rate is improved. Accordingly, an insulating film (silicon oxide film) having a good film quality is formed.

Figure 10:
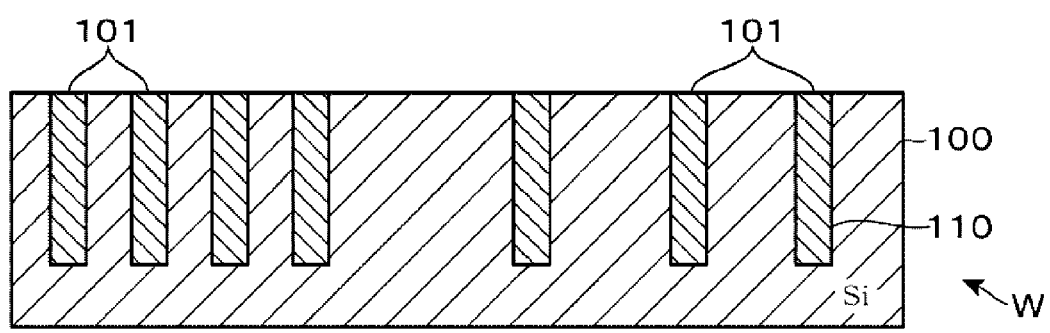
FIG. 10 is an explanatory view illustrating planarization of a surface of an insulating film.

After the insulating film is cured, as illustrated in FIG. 10, an excessive coating film 101 on the surface of the wafer W is removed by, for example, a chemical mechanical polishing (CMP) process. At this time, when the strength of the coating film 101 is low, it is difficult to polish the coating film 101 by the CMP process. However, since the coating film 101 is a silicon oxide film with a high denseness and has a sufficiently high strength, the coating film 101 is polished by the CMP process so as to expose the silicon film 100 on the surface of the wafer W.

Figure 11:
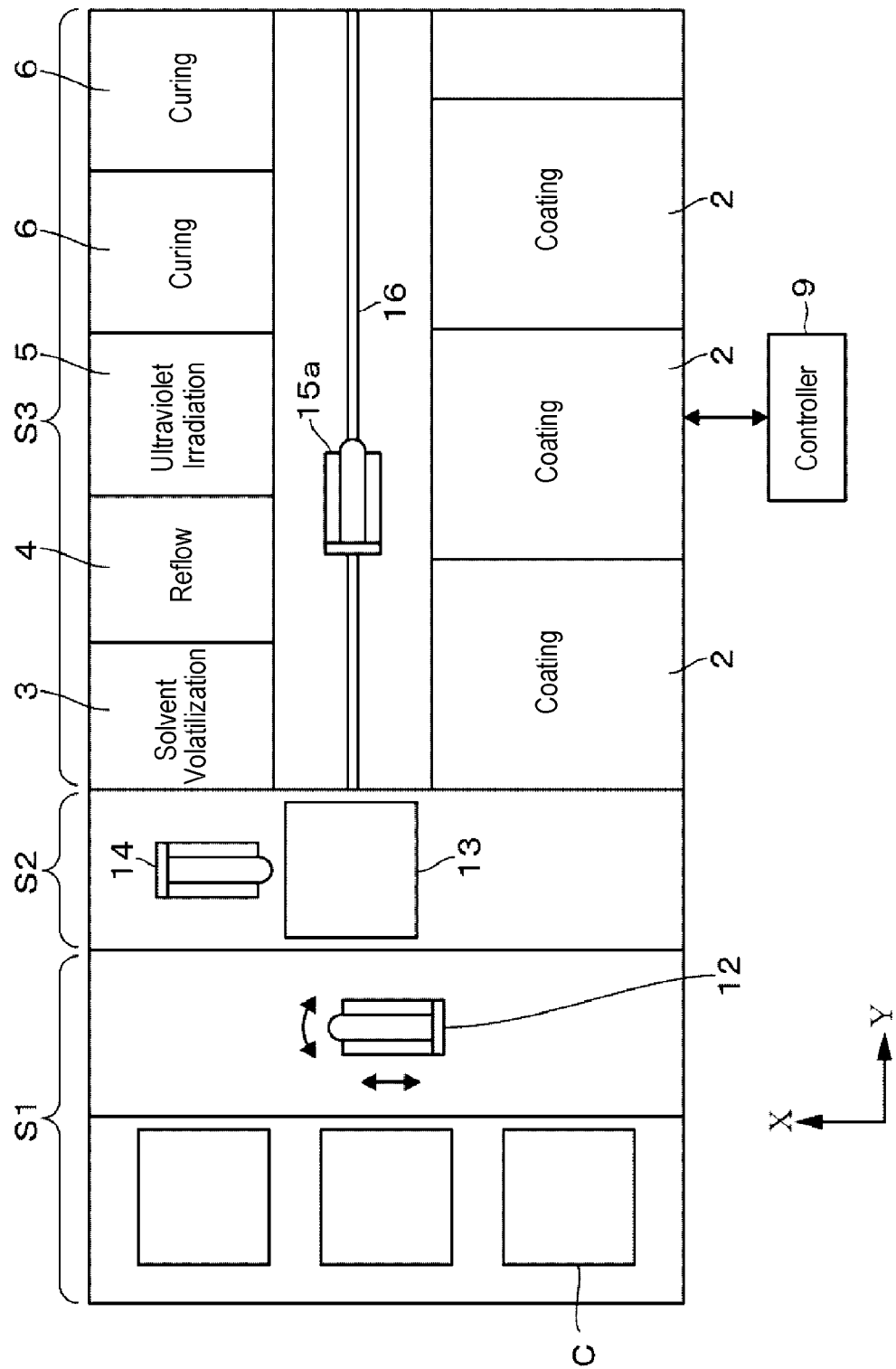
FIG. 11 is a plan view showing an insulating film forming device.
Figure 12:
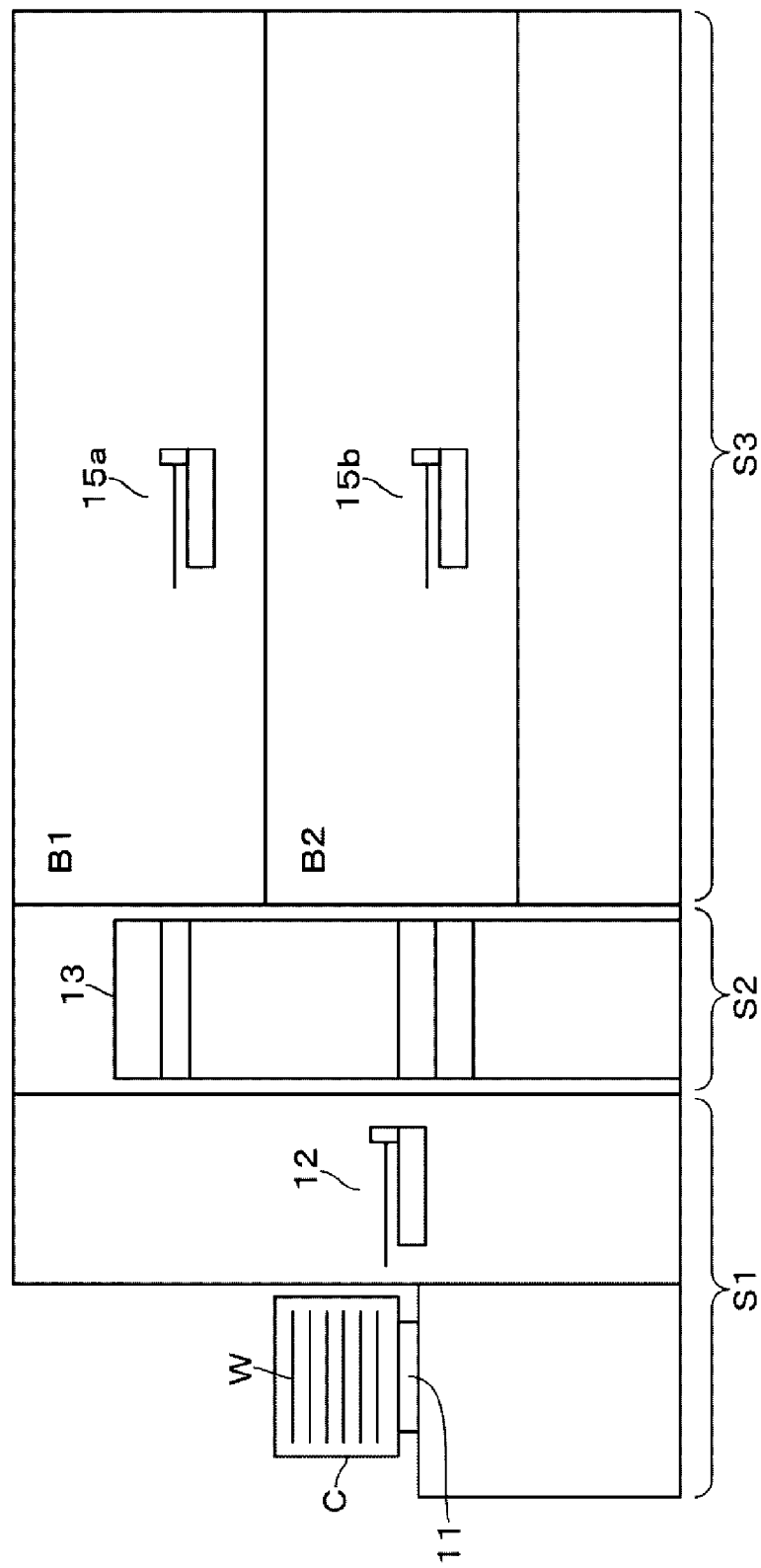
FIG. 12 is a vertical sectional view of the insulating film forming device for an insulating film.

Next, an insulating film forming device for performing the above-described insulating film forming method will be described. As illustrated in FIGS. 11 and 12, the insulating film forming device includes a carrier block S1, which is a loading/unloading port for loading and unloading a wafer W from a carrier C as a transfer container accommodating a plurality of wafers W, a relay block S2, and a processing block S3, which are connected to one another in a row.

The carrier block S1 includes a stage 11 on which a plurality (e.g., three) of carriers C configured to store and transfer a plurality of wafers W are mounted, for example, in a lateral direction (the X direction), and a delivery mechanism 12, which is a transfer arm configured to perform delivery of wafers W with respect to the interior of the carriers C placed on the stage 11. The delivery mechanism 12 is configured such that a holder by which the wafer W is held is movable forward and rearward, movable in the X direction, rotatable around a vertical axis, and movable upward and downward.

The relay block S2 has a role of delivering the wafer W taken out of the carrier C in the carrier block S1 to the processing block S3. The relay block S2 includes a delivery shelf 13 having a plurality of vertically arranged stages on which the wafers W are placed, and a vertically movable transfer mechanism 14 configured to transfer the wafers W between the stages of the delivery shelf 13. In the delivery shelf 13, the stages are disposed at a height position where main transfer mechanisms 15a and 15b provided in the processing block S3 can perform delivery of the wafers W, and at a height position where the delivery mechanism 12 can perform delivery of the wafers W.

The processing block S3 has a two-story structure in which processing blocks B1 and B2 are stacked one on another. The processing blocks B1 and B2 are configured in substantially the same manner, and the processing block B1 will be described as an example. The processing block B1 includes the main transfer mechanism 15a, which is configured to be movable along a transfer path 16 formed of, for example, a guide rail extending in a front-rear direction (the Y direction) when viewed from the relay block S2. In the processing block B1, modules for processing the wafers W are disposed on the left and right sides of the transfer path 16. In the processing block B1, for example, coating modules 2 configured to apply a coating liquid are provided on the right side of the loading/unloading block S1. On the left side, for example, solvent volatilization modules 3, a reflow module 4, an ultraviolet ray irradiation module 5, and two curing modules 6 are arranged side by side from the side of the relay block S2.

The insulating film forming device further includes a controller 9 constituted with, for example, a computer. The controller 9 has a program storage configured to store a program which includes instructions for executing transfer of the wafers W in the film forming device or executing processing sequences of the wafers W in respective modules. The program is stored in a storage medium such as, for example, a flexible disk, a compact disk, a hard disk, a magneto-optical (MO) disk, a memory card, or the like, and is installed in the controller 9.

A flow of the wafer W in the insulating film forming device will be briefly described. When the carrier C accommodating the wafer W is placed on the stage 11, the wafer W is transferred to the processing block B1 or B2 through the delivery mechanism 12, the delivery shelf 13, and the movable transfer mechanism 14. Thereafter, the coating film 101 is applied on the wafer W by the coating module 2, and the wafer W is transferred the solvent volatilization module 3, the reflow module 4, the ultraviolet ray irradiation module 5, and the curing module 6 in this order so that an insulating film is formed on the wafer W. Thereafter, the wafer W is delivered to the delivery shelf 13, and is returned to the carrier C by the movable transfer mechanism 14 and the delivery mechanism 12.

The insulating film forming device may further include a polishing device configured to perform a CMP process. For example, the polishing device may be provided in place of one of the curing modules 6. In this case, the wafer W that has been subjected to the curing process in the curing module 6 may be polished by the CMP process.

Figure 13:
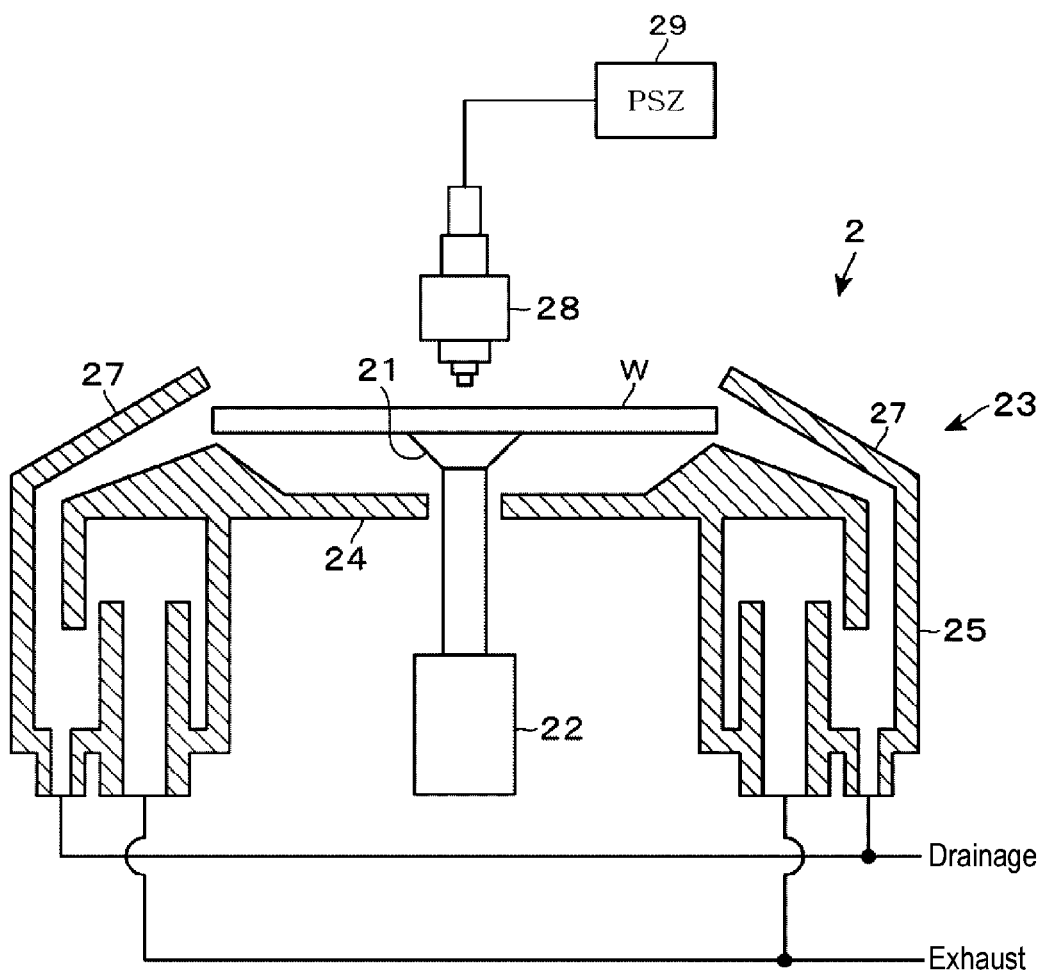
FIG. 13 is a sectional view illustrating a coating module provided in the film forming device.

Next, the coating module 2 will be described. The coating module 2 applies, for example, a coating liquid, which is obtained by dissolving polysilazane as a precursor of the insulating film in an organic solution, to the wafer W having a pattern formed thereon by a known spin coating method. As illustrated in FIG. 13, the coating module 2 includes a spin chuck 21 configured to suction-hold the wafer W and configured to be rotatable and movable upward and downward by a drive mechanism 22. Reference numeral 23 in FIG. 13 denotes a cup module. In FIG. 13, reference numeral 24 denotes a guide member having downwardly extending outer and inner peripheral walls, which are formed in a cylindrical shape.

A discharge space is formed between an outer cup 25 and the outer peripheral wall, and a structure configured to allow a gas-liquid separation is provided below the discharge space. Around the guide member 24, a liquid receiver 27 extending from an upper end of the outer cup 25 toward a center side is provided so as to receive a liquid shaken off from the wafer W. The module 2 further includes a coating liquid nozzle 28. The coating liquid such as polysilazane is supplied from a coating liquid supply source 29 storing the coating liquid to the central portion of the wafer W via the coating liquid nozzle 28, and the wafer W is rotated at a predetermined rotation speed around the vertical axis. Thus, the coating liquid is spread on the surface of the wafer W and the coating film is formed on the surface of the wafer W.

Figure 14:
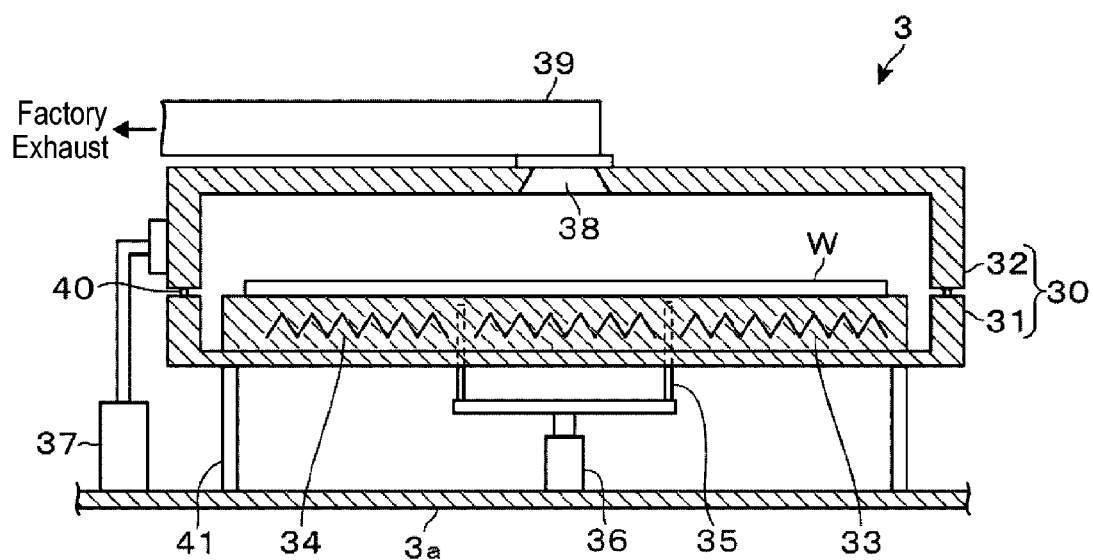
FIG. 14 is a sectional view illustrating a solvent volatilization module provided in the film forming device.

Next, the solvent volatilization module 3 will be described. As illustrated in FIG. 14, the solvent volatilization module 3 is provided in a housing (not illustrated) and includes a processing container 30, which includes a base 31 formed of a flat cylindrical body having an open top and a lid 32 configured to move upward and downward with respect to the base 31 so as to open and close the processing container 30. The base 31 is supported on a bottom surface 3a of the housing via a support 41. In addition, the base 31 is provided with a heating plate 33 in which a heating mechanism 34 is embedded so as to heat the wafer W placed on the heating plate 33, for example, to 100 to 250 degrees C. On the bottom surface 3a of the housing, a lift mechanism 36 configured to move upward and downward lift pins 35 is provided. By passing the lift pins 35 through the bottom portion of the base 31 and the heating plate 33, a delivery of the wafer W to and from the external main transfer mechanism 15a is carried out.

The lid 32 is formed of a flat cylindrical body having an open bottom. An exhaust port 38 is formed in a center portion of a ceiling plate of the lid 32, and an exhaust pipe 39 is connected to the exhaust port 38. Assuming that a side of the processing container 30 is an upstream side, a downstream end of the exhaust pipe 39 is connected to a common exhaust duct installed in a factory.

The lid 32 is placed so as to be in contact with pins 40 provided on an upper surface of a peripheral wall of the base 31 and to form a slight gap between the lid 32 and the base. Thus, a processing space in which the wafer W is heated is defined. By exhausting air from the exhaust port 38, an atmosphere in the housing flows into the processing container from the gap between the lid 32 and the base 31. In addition, the lid 32 is configured to be movable upward and lowered between a lowered position where the lid 32 closes the processing container 30 and a raised position where the wafer W is delivered to the heating plate 33. In this example, the upward and downward movement of the lid 32 is performed by driving a lift mechanism 37 installed on an outer peripheral surface of the lid 32.

The reflow module 4 has substantially the same configuration as the solvent volatilization module 3 except that the reflow module 4 is configured to heat the wafer W to 200 to 300 degrees C. using the heating mechanism 34.

Figure 15:
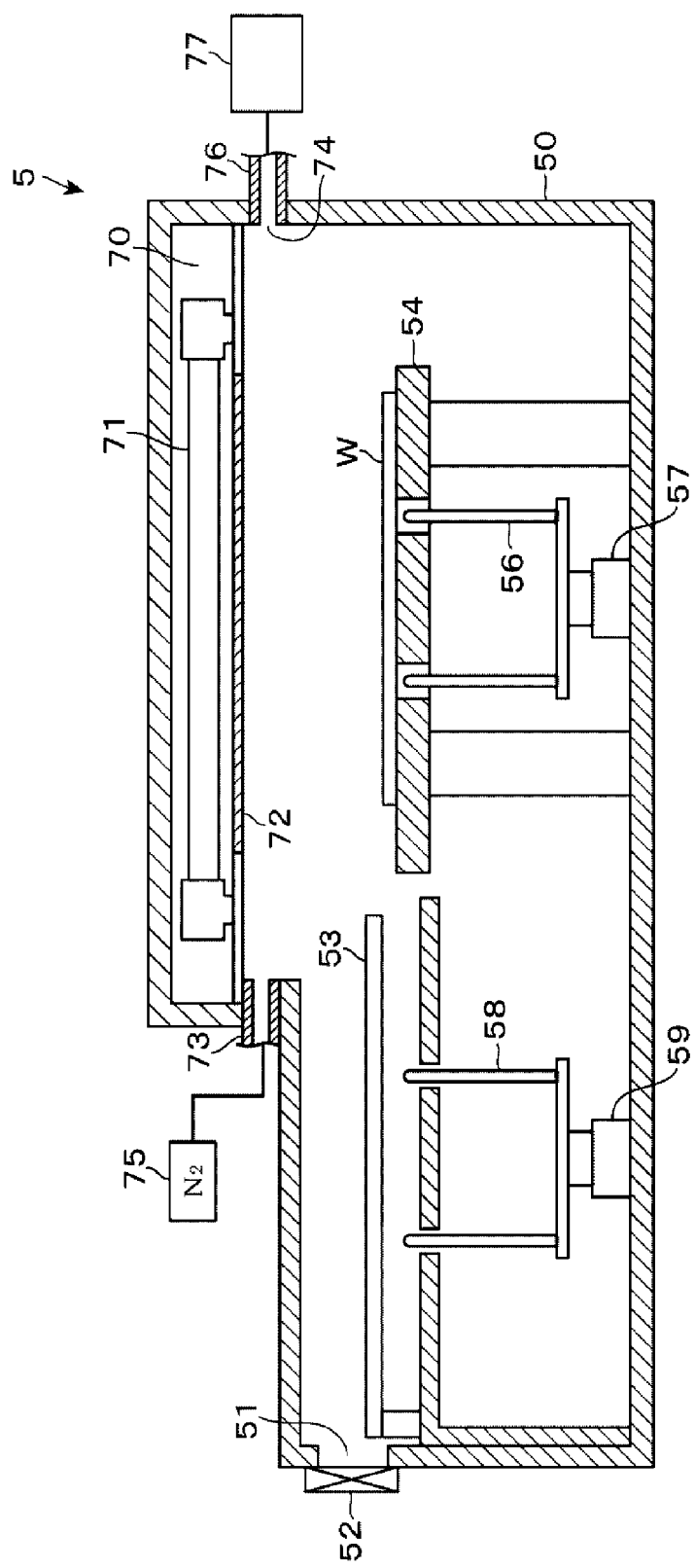
FIG. 15 is a sectional view illustrating an ultraviolet irradiation module provided in the film forming device.

The ultraviolet ray irradiation module 5, which is an energy supply module, includes a rectangular housing 50 that is flat and elongated in a front-rear direction as illustrated in FIG. 15. A loading/unloading port 51 for loading and unloading the wafer W and a shutter 52 for opening and closing the loading/unloading port 51 are provided inn a front side wall of the housing 50.

In the housing 50, a transfer arm 53 configured to transfer the wafer W is provided on the front side when viewed from the loading/unloading port 51. The transfer arm 53 is configured as a cooling plate, and is configured to cool the wafer W to room temperature (25 degrees C.), for example, after the reflow process and before the ultraviolet ray irradiation process. Inwardly from the loading/unloading port 51, a stage 54 of the wafer W is disposed. Lift pins 56 and 58 for use in a wafer delivery are provided below the stage 54 and the transfer arm 53, respectively. The lift pins 56 and 58 are configured to be movable upward and downward by lift mechanisms 57 and 59, respectively.

Above the stage 54, a lamp chamber 70 is provided. The lamp chamber 70 accommodates an ultraviolet lamp 71 such as a xenon lamp, which irradiates ultraviolet rays having, for example, a main wavelength of 172 nm, to the wafer W placed on the stage 54. In a lower surface of the lamp chamber 70, a light-transmission window 72 configured to transmit the ultraviolet rays, which has the wavelength of 172 nm and irradiated from the ultraviolet lamp 71 toward the wafer W. In addition, a gas supply 73 and an exhaust port 74 facing each other are provided in a side wall below the lamp chamber 70. A $N_2$ gas supply source 75 configured to supply a $N_2$ gas to the interior of the housing 50 is connected to the gas supply 73. An exhaust mechanism 77 is connected to the exhaust port 74 via an exhaust pipe 76.

When irradiating the wafer W placed on the stage 54 with the ultraviolet rays, the $N_2$ gas is supplied from the gas supply 73 and is exhausted such that the atmosphere around the wafer W becomes a low-oxygen atmosphere, for example, a $N_2$ gas atmosphere of 400 ppm or less, preferably 50 ppm or less. When the wafer W cooled to room temperature is mounted on the stage 54 on the transfer arm 53, the $N_2$ gas is supplied from the $N_2$ gas supply source 75, and an energy of, for example, 4,000 $mJ/cm^2$ is irradiated to the wafer W in the low-oxygen atmosphere.

Figure 16:
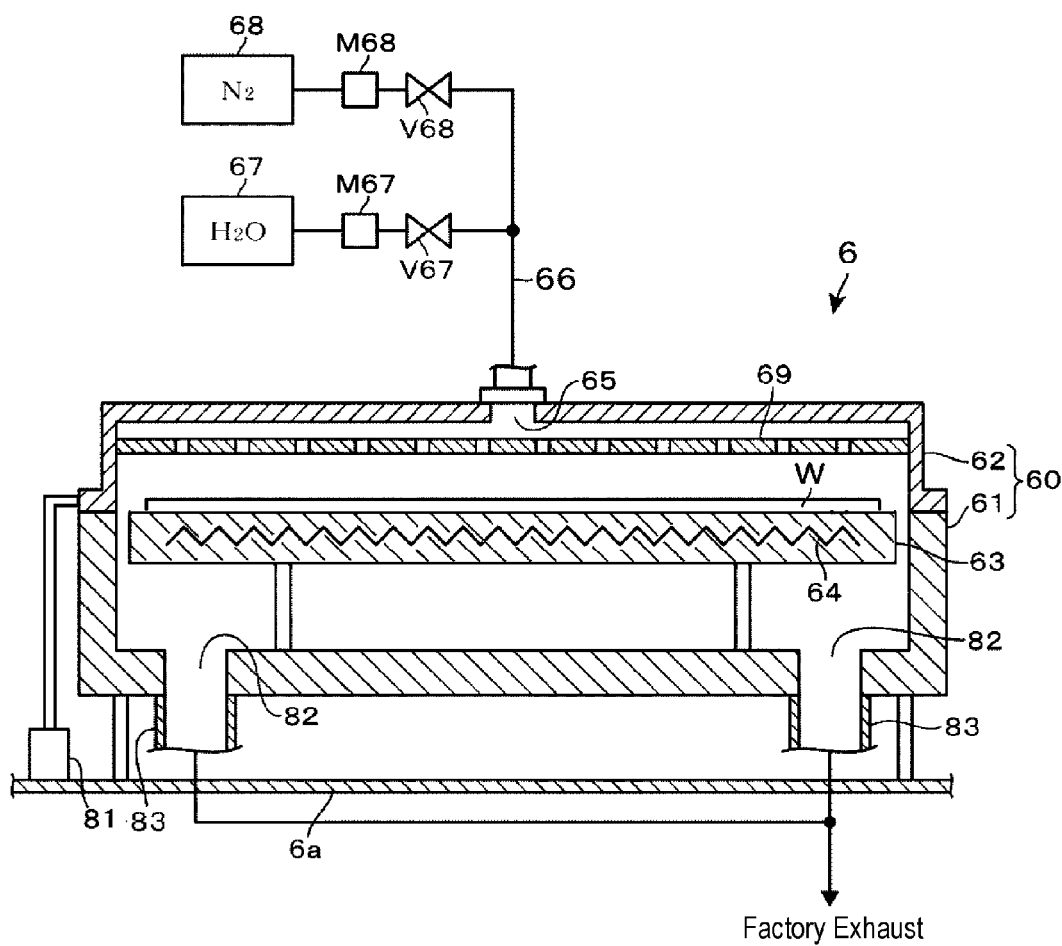
FIG. 16 is a cross-sectional view illustrating a curing module provided in the film forming device.

Next, the curing module 6 will be described. As illustrated in FIG. 16, the curing module 6 is provided in a housing (not illustrated) and includes a processing container 60 which includes a lid 62 and a base 61. A stage 63 configured to place the wafer W on the stage 63 is provided in the processing container 60, and a heating mechanism 64 configured to heat the wafer W placed on the stage 63 to, for example, 350 to 450 degrees C. is provided in the stage 63. Further, a gas inlet port 65 is provided in a ceiling plate of the lid 62, and one end of a gas supply pipe 66 is connected to the gas inlet port 65. The other end of the gas supply pipe 66 is branched into two branches. One of the branches is connected to a vapor supply source 67 configured to supply vapor to the interior of the processing container 60, and the other one of the branches is connected to a $N_2$ gas supply source 68 configured to supply a $N_2$ gas to the interior of the processing container 60. In FIG. 16, reference numerals V67 and V68 denote valves, and reference numerals M67 and M68 denote flow rate adjusters.

In the lid 62, a gas diffusion plate 69 is provided below the gas inlet port 65 so as to face an upper surface of the stage 63. The gas diffusion plate 69 is formed of, for example, a punched plate. A gas introduced into the processing container 60 from the gas inlet port 65 is diffused in the gas diffusion plate 69, and is then supplied toward the wafer W placed on the stage 63. Exhaust ports 82 are formed in the base 61. One ends of exhaust pipes 83 are connected to the exhaust ports, and the other ends of the exhaust pipes 83 are connected to an exhauster.

The lid 62 is configured to be movable upward and downward by a lift mechanism 81 provided on a bottom surface of the housing, and the wafer W is loaded into the processing container 60 in a state where the lid 62 is moved upward, and is placed on the stage 63. Then, by moving the lid 62 downward, the processing container 60 is sealed, and a processing space to which a water vapor is supplied while the wafer W placed on the stage 63 is heated is defined.

Then, when the wafer W subjected to the above-described ultraviolet ray irradiation process is placed on the stage 63, the processing container 60 is filled with the water vapor and the wafer W is heated stepwise at 400 degrees C. for 30 minutes and at 450 degrees C. for 120 minutes. Then, the supply of the water vapor is stopped, and the wafer W is heated at 450 degrees C. for 30 minutes under a nitrogen gas atmosphere.

According to the above-described embodiment, after the coating liquid containing polysilazane is applied to the wafer W and the solution in the coating film 101 is volatilized, and before the curing process is performed, the coating film 101 is irradiated with ultraviolet rays in a nitrogen atmosphere. Thus, dangling bonds are easily formed at portions in the polysilazane to be hydrolyzed. Since the dangling bonds are formed in advance in silicon, which corresponds to the portions to be hydrolyzed, the productivity of hydroxyl groups is increased. That is to say, since the energy required for the hydrolysis is reduced, even when the curing process is performed at a temperature of 350 degrees C., the number of portions remaining without being hydrolyzed is reduced. As a result, since the dehydration synthesis occurs efficiently, the crosslinking ratio is improved and it possible to form a dense (good quality) insulating film.

Figure 17:
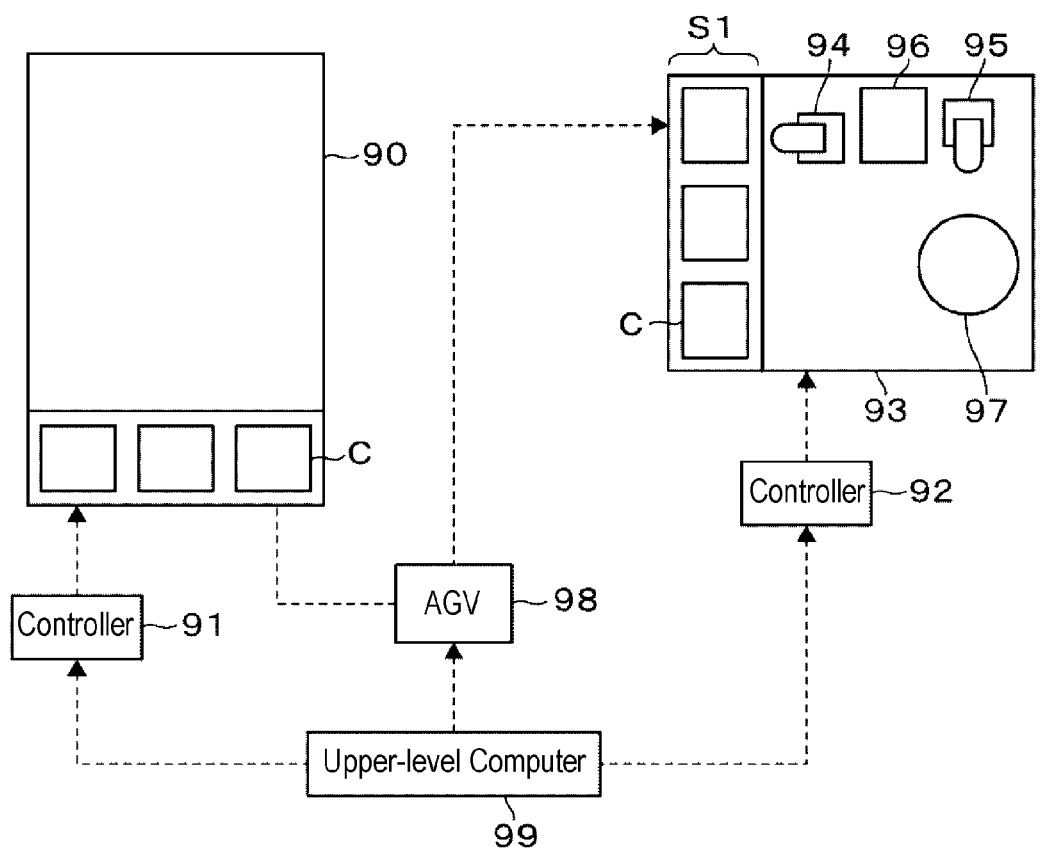
FIG. 17 is a plan view illustrating a substrate processing system according to an embodiment of the present disclosure.

The present disclosure may be also applied to a substrate processing system that includes a film forming device configured to perform the processes from the coating process to the ultraviolet ray irradiation process, and an additional heat treatment device configured to perform the curing process. In such a substrate processing system, the wafer W irradiated with the ultraviolet rays in the film forming device is transferred to the heat treatment device, and is subjected to the curing process in the heat treatment device. As illustrated in FIG. 17, the substrate processing system includes a substrate processing device 90 having the same configuration as the insulating film forming device illustrated in FIGS. 11 and 12 except that a curing module is not provided, and a heat treatment device 93 including a heat treatment furnace 97 configured to perform a heat treatment on the wafer W. A transfer vehicle (AVG) 98, which is a container transfer mechanism configured to transfer a carrier C between the substrate processing device 90 and the heat treatment device 93, is provided. The heat treatment device 93 includes a carrier block 51 to which the carrier C is transferred, a delivery mechanism 94 configured to take out a wafer from the carrier C, a shelf 96 on which the wafer W taken out from the carrier C is placed, and a movable transfer mechanism 95 configured to transfer the wafer W placed on the shelf 96 to the heat treatment furnace 97. As the heat treatment furnace 97, for example, a well-known heat treatment furnace in which a heat treatment (the curing process) is performed by placing a plurality of substrates on a substrate holder in the form of a shelf and loading the substrate holder into a vertical reaction tube surrounded by a heater.

The substrate processing system further includes an upper-level computer 99 configured to transmit control signals to a controller 91 of the substrate processing device 90 and to a controller 92 of the heat treatment device 93. The controller 92 is provided with a program for executing the transfer of the wafer W and the curing process on the wafer W. The upper-level computer 99 is further configured to control the transfer of the carrier C by the transfer vehicle 98. The upper-level computer 99 stores a program for executing the insulating film forming method described above. Thus, the substrate processing device 90 performs the processes from applying the coating liquid to the wafer W to the ultraviolet ray irradiation process, the wafer W irradiated with the ultraviolet rays is accommodated in the carrier C and transferred to the heat treatment device 93 by the transfer vehicle 98, and the curing process is performed in the heat treatment device 93. The insulating film forming method can be also performed in the substrate processing system. Thus, even when a substrate processing system including a heat treatment furnace is used, it is possible to form an insulating film having a high strength. Further, since it is possible to reduce the temperature during the curing process, it is not necessary for the substrate processing system to have a dedicated heat treatment furnace for performing a high-temperature process during the insulating film forming method.

In addition, in the above-described embodiment, the curing process may be performed by heating the wafer while supplying an ammonia gas. Alternatively, the gas supplied during the curing process may be a $N_2$ gas.

In addition, the present disclosure may be applied to forming an interlayer insulating film such as a low dielectric constant film. In forming the interlayer insulating film, the heating temperature is required to be 450 degrees C. or less, for example, 400 degrees C. or less, in order to suppress migration or diffusion of copper, which is a wiring material. Further, it is desirable that the temperature is set to be 300 degrees C. or more from the viewpoint of forming the interlayer insulating film to have a sufficient hardness. Since an insulating film having a good film quality can be obtained even at a low curing temperature in the present disclosure, it is expected that the present disclosure is applicable to forming an interlayer insulating film. In addition, as an example of forming an insulating film on a substrate in which a narrow groove is formed, the present disclosure may be applied to forming a pre-metal dielectric (PMD).

Figure 18:
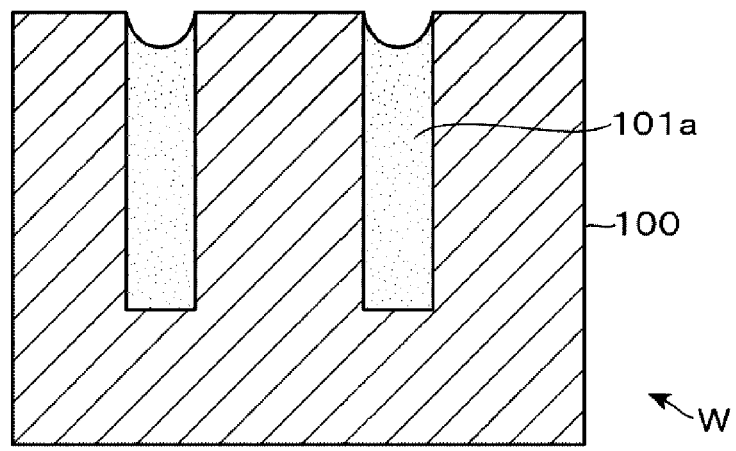
FIG. 18 is an explanatory view for explaining an insulating film forming process according to another example of the embodiment of the present disclosure.

In the present disclosure, the insulating film may be formed by applying a coating liquid a plurality of times. For example, in the insulating film forming device illustrated in FIGS. 11 and 12, the wafer W in which the trenches 110 are formed is transferred to the coating module 2, and a first application of the coating liquid is performed. As a result, for example, as illustrated in FIG. 18, a coating film 101*a* is formed such that the coating liquid has entered the inside of the trenches 110 formed in the silicon film 100. In FIGS. 18 to 23, the coating film formed by the first application of the coating liquid is indicated by reference numeral 101*a*, and the coating film formed by a second application of the coating liquid is indicated by reference numeral 101*b*.

Figure 19:
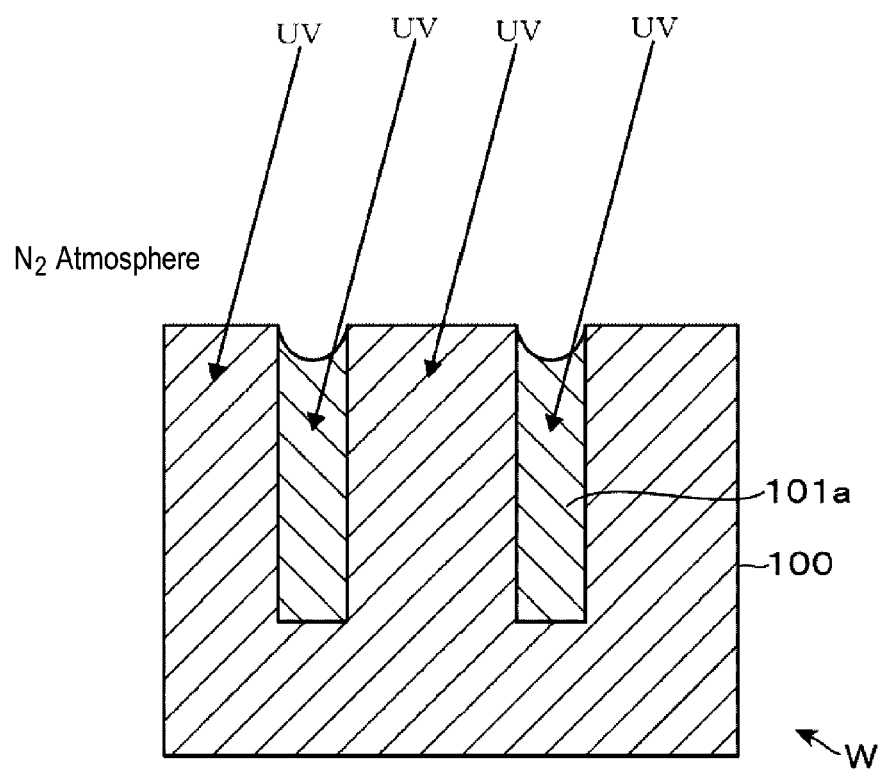
FIG. 19 is an explanatory view for explaining the insulating film forming process according to another example of the embodiment of the present disclosure.
Figure 20:
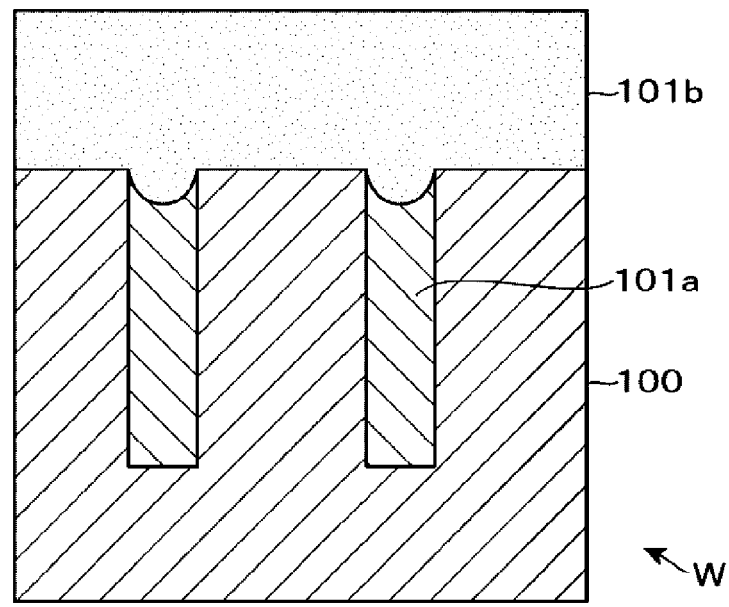
FIG. 20 is an explanatory view for explaining the insulating film forming process according to another example of the embodiment of the present disclosure.
Figure 21:
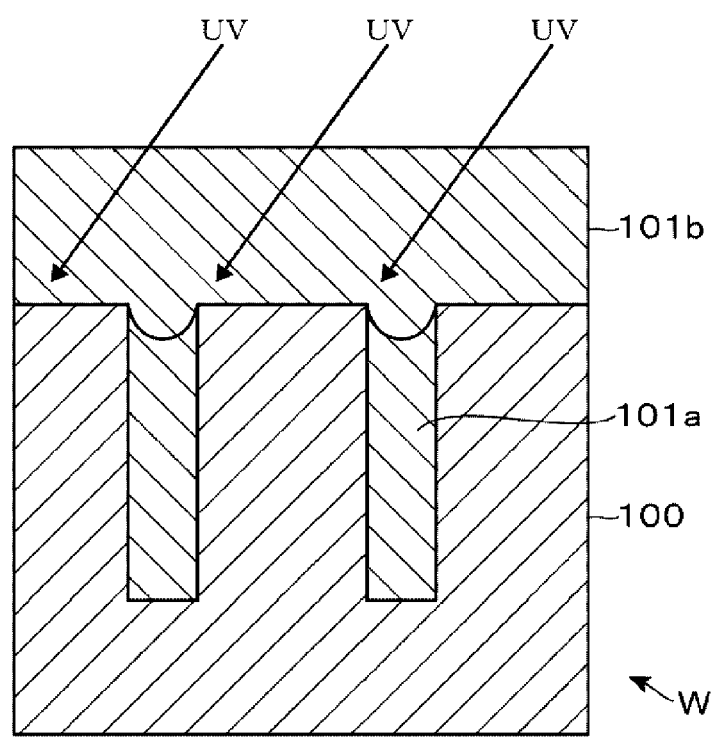
FIG. 21 is an explanatory view for explaining the insulating film forming process according to another example of the embodiment of the present disclosure.
Figure 22:
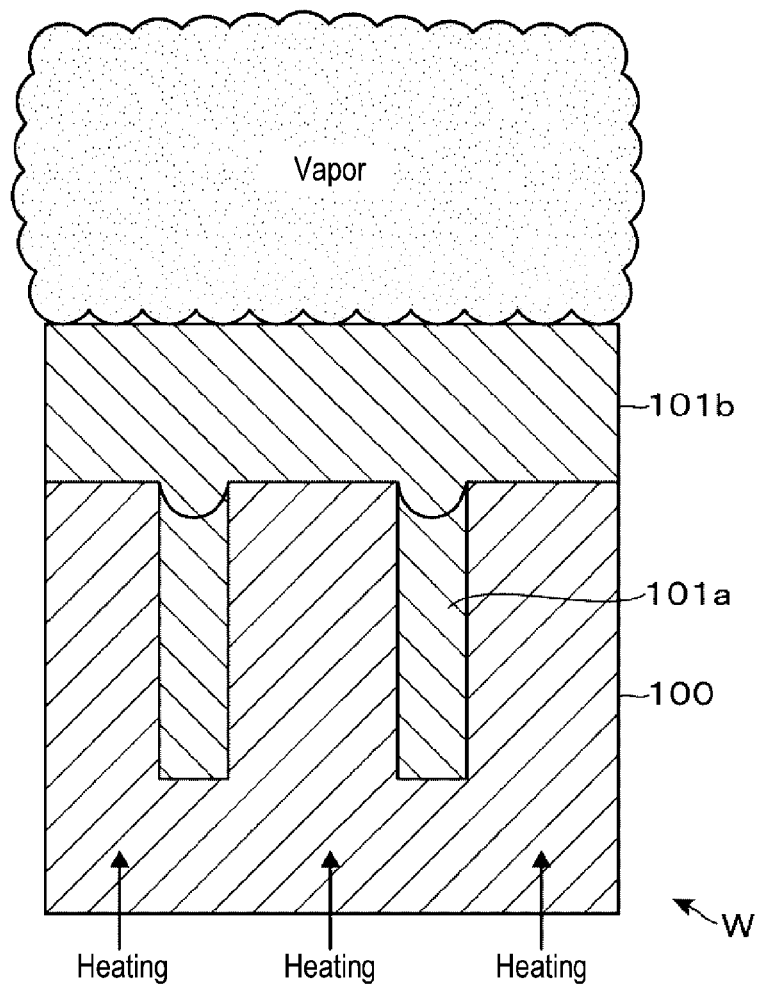
FIG. 22 is an explanatory view for explaining the insulating film forming process according to another example of the embodiment of the present disclosure.
Figure 23:
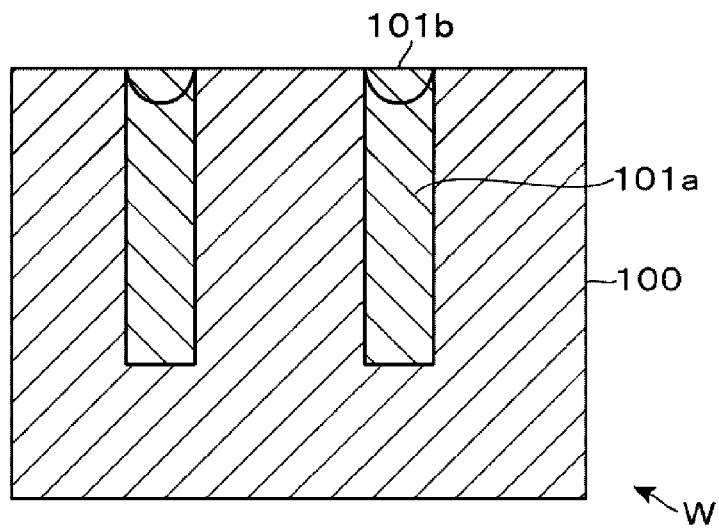
FIG. 23 is an explanatory view for explaining the insulating film forming process according to another example of the embodiment of the present disclosure.

Thereafter, as described in the embodiment, the wafer W is transferred to the solvent volatilization module 3 to volatilize the solution, and is then transferred to, for example, the ultraviolet ray irradiation module 5, and the coating film 101*a* is irradiated with the ultraviolet rays in a low oxygen atmosphere as illustrated in FIG. 19. Subsequently, the wafer W is transferred to the coating module 2, and the second coating process is performed. As a result, as illustrated in FIG. 20, the coating film 101*b* is further deposited on the wafer W. Thereafter, the wafer W is transferred to the solvent volatilization module 3 to volatilize the solution, and is then transferred to the ultraviolet ray irradiation module 5, and the coating film 101*b* is irradiated with the ultraviolet rays in the low oxygen atmosphere as illustrated in FIG. 21. Subsequently, the wafer W is transferred to the curing module 6 and is heated stepwise at 400 degrees C. and 450 degrees C., for example, in a vapor atmosphere, and is then heated to 450 degrees C. in a $N_2$ gas atmosphere as illustrated in FIG. 22. Thereafter, for example, the wafer W is transferred to a CMP device, and as illustrated in FIG. 23, the coating film 101*b* on the surface of the wafer is removed by the CMP process.

When the coating films 101*a* and 101*b* are irradiated with the ultraviolet rays, the ultraviolet rays are transmitted from surface portions of the coating films 101*a* and 101*b* to lower portions of the coating films 101*a* and 101*b*. Thus, the lower portions of the coating films 101*a* and 101*b* are likely to be weakened compared to the surface portions, and Si—H bonds may not be sufficiently turned into dangling bonds. Therefore, when the curing process is performed on the wafer W, the crosslinking rate may be low in the lower portion of the coating films 101*a* and 101*b*, which causes the crosslinking rate of the entire film to be low. In addition, when the coating film in the surface portion is removed by the CMP process, for example, there is a concern that a layer having a poor film quality may be exposed from the coating film.

Therefore, by forming the coating films 101*a* and 101*b* having a predetermined thickness by repeating the application of the coating films 101*a* and 101*b* and the irradiation of the ultraviolet rays, the ultraviolet rays can be irradiated in a state where each of the coating films 101*a* and 101*b* is thin, and it becomes easy to form the dangling bonds in the entire portions of the coating films 101*a* and 101*b*. Therefore, when the curing process is performed, the crosslinking is likely to be formed in the entire portions of the coating films 101*a* and 101*b*, and it is possible to form the coating films 101*a* and 101*b* to have a high denseness and a high crosslinking rate over the entire portions. As a result, as illustrated in Example 2 described later, it is possible to form a denser insulating film having a high etching resistance.

In addition, after the first application process, the volatilization of the solution, and the irradiation of the ultraviolet rays to the coating film 101*a* in the low oxygen atmosphere are performed, the wafer may be further transferred to the curing module 6 and may be heated to 350 degrees C. in, for example, a vapor atmosphere. Then, after the second application process is performed and the solution is volatilized, the coating film 101*b* may be irradiated with the ultraviolet rays in the low oxygen atmosphere and the curing process may be further performed.

Furthermore, after the solution is volatilized in the first application process and the second application process, the reflow process of heating the wafer W, for example, at 250 degrees C. may be performed.

Figure 24:
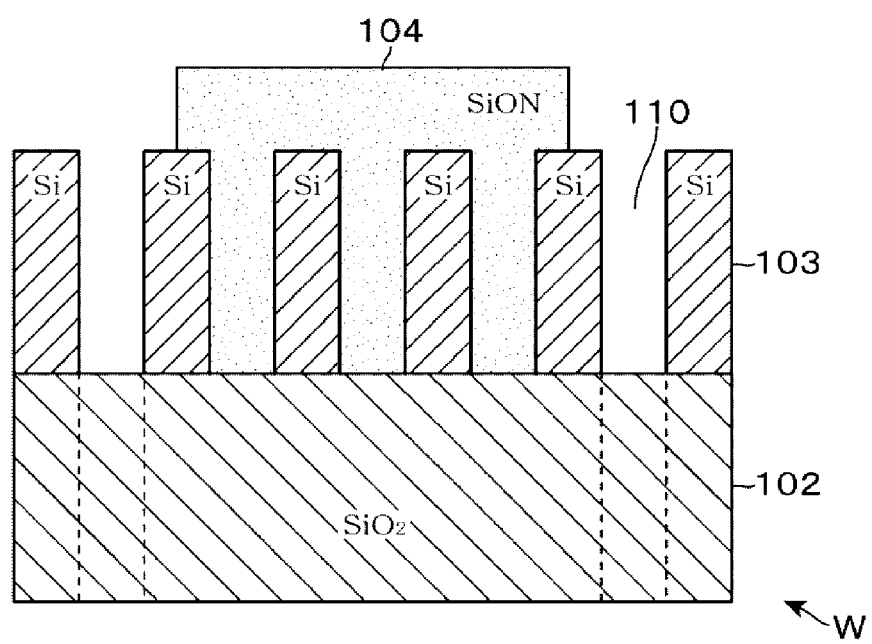
FIG. 24 is a sectional view illustrating a surface structure of a wafer according to another example of the embodiment of the present disclosure.

The present disclosure may be also applied to, for example, a process of forming a sacrificial film. FIG. 24 illustrates an example of a substrate to be processed on which a sacrificial film is formed. As illustrated in FIG. 24, in the wafer W, a polysilicon layer 103 is formed on an upper surface of a $SiO_2$ film 102, and trenches 110 are formed so as to penetrate the polysilicon layer 103 in a thickness direction. Then, a SiON film 104 as a sacrificial film is formed on the upper surface of the wafer W. FIG. 24 illustrates a section of a surface layer portion of the wafer W after the SiON film 104 is formed and then is etched in a predetermined pattern. In the wafer W, the SiO2 layer 102, which is not covered by the SiON film 104 and faces bottom portions of the trenches 110 from which the SiON film 104 is removed, is etched by using an etching selectivity of the $SiO_2$ layer 102 with respect to the SiON film 104 and the polysilicon layer 103.

It is desirable that a sacrificial film has a good embeddability because the sacrificial film such as the SiON film 104 is formed on the wafer W in which unevenness such as a circuit pattern is formed. Therefore, it is desirable to form the sacrificial film by applying a coating liquid. In addition, it is desirable that the sacrificial film has a high etching resistance so as to sufficiently increase an etching selectivity with respect to a film to be etched (here, the $SiO_2$ film 102).

In forming the SiON film 104, for example, a coating liquid containing polysilazane as a precursor is applied to the wafer W. Thereafter, as illustrated in FIGS. 3 to 6, the coating film 101 is heated at 150 degrees C. for three minutes to volatilize the solution in the coating film 101, and is then heated at 250 degrees C. to reflow the coating film 101. Subsequently, ultraviolet rays of 5,000 $J/cm_2$ or less are irradiated toward the coating film 101 in a low oxygen atmosphere. Thereafter, a curing process is performed in the curing module 6 such that the wafer W is heated stepwise at 400 degrees C. and 450 degrees C. in a $N_2$ gas atmosphere.

In the polysilazane contained as a precursor, when proceeding with the dehydration synthesis of oligomers contained in the coating film 101 as described above, —Si(NH)Si— contained in the polysilazane is replaced by Si—O—Si bonds. A high replacement rate of —Si(NH)Si— by Si—O—Si bonds forms more $SiO_2$, while SiON having a high N concentration is formed by remaining more —Si(NH)Si—. Therefore, after the coating film 101 is irradiated with the ultraviolet rays, the coating film 101 is heated to 350 degrees C. in a $N_2$ gas atmosphere in the curing process, for example. At this time, by performing the curing process at such a low temperature, for example, 350 to 450 degrees C., the replacement of —Si(NH)Si— is suppressed, and dangling bonds formed by the irradiation of the ultraviolet rays are subjected to the hydrolysis and the dehydration synthesis as already described above, so that the formation of Si—O—Si bonds proceeds. Therefore, it is possible to crosslink the oligomers of the polysilazane so as to form a strong film, and it is possible to suppress desorption of nitrogen so as to form a SiON film having a high nitrogen content rate.

In the process of irradiating ultraviolet rays, when the temperature is increased to a temperature at which crosslinking proceeds, for example, 350 to 400 degrees C. in the case of polysilazane, formation of the dangling bonds may proceed simultaneously with the hydrolysis and the dehydration synthesis. Thus, isolated oligomers are trapped in bonded oligomers, resulting in a low denseness of the insulating film.

Therefore, it is desirable to set the temperature when the ultraviolet rays are irradiated to be 350 degrees C. or less. In addition, since a requirement is that the temperature during the irradiation of the ultraviolet rays is set to be a temperature at which crosslinking does not occur, the ultraviolet rays may be irradiated in the reflow process. However, in the solvent volatilization process, there is a possibility that the solution, which is a solvent, may be changed by the irradiation of the ultraviolet rays. Therefore, it is necessary to perform the irradiation of the ultraviolet rays after the solvent volatilization process.

When an amount of energy in the ultraviolet ray irradiation process is excessively large, bonds other than the Si—H bonds may be broken. Therefore, the irradiation amount of energy is preferably 5000 $J/cm^2$ or less, and the irradiation dose may be sufficient if it can terminate ends of Si—H bonds.

In addition, as illustrated in Example 3 described later, it is possible to enhance the effect by performing the above-described insulating film forming method by setting the heating temperature of the wafer W in the solvent volatilization process to 200 to 250 degrees C. This is presumed as a synergistic effect of reduction in energy absorbed by the solution, which is obtained by removing the solution in the coating film 101 more reliably, and occurrence of an effect corresponding to the rearrangement of oligomers in the reflow process, which is obtained in Example 3 without performing the reflow process.

From the viewpoint of efficiently forming the dangling bonds, it is desirable to use an energy of a wavelength, which is absorbed by the coating film without transmitting the coating film. Therefore, in the case of the ultraviolet rays, the main wavelength is preferably 200 nm or less. For example, ultraviolet rays having a wavelength of 193 nm from such as an ArF lamp may be used, or a deuterium lamp or the like may be used. In addition, an electron beam or the like may be used as the energy irradiated to the coating film.

In addition, a device for use in the solvent volatilization process to volatilize the solution in the coating film 101 may be a device that volatilizes the solution by reducing a pressure in a sealed processing container to half of atmospheric pressure so as to promote volatilization of the solution in the wafer W placed in the processing container.

EXAMPLE

<Evaluation Test 1>

The following tests were conducted to verify the effects of the embodiments of the present disclosure. Using the substrate processing system illustrated in FIG. 17, an insulating film was formed on a test wafer W, and the etching resistance of the insulating film was evaluated.

[Example 1]

An example in which ultraviolet rays having a main wavelength of 172 nm was irradiated in a $N_2$ gas atmosphere so as to have a dose amount of 2,000 $mJ/cm^2$ in the ultraviolet ray irradiation process in the insulating film forming method was taken as Example 1. After applying the coating liquid described in the embodiment, the wafer W was heated at 150 degrees C. for three minutes in the solvent volatilization process, and then the ultraviolet irradiation process was performed without performing the reflow process. In the subsequent curing process, in a state where water vapor is supplied to a heat treatment furnace, a two-stage heating process was performed at 400 degrees C. for thirty minutes and 450 degrees C. for 120 minutes, and then the wafer was heated at 450 degrees C. for thirty minutes under a $N_2$ gas atmosphere. In addition, a target film thickness of the coating film was 100 nm.

[Comparative Examples 1 and 2]

In Comparative Example 1, the wafer was processed in the same manner as Example 1, except that ultraviolet rays of 2,000 mJ/cm$^2$ was radiated in atmospheric atmosphere in the ultraviolet ray irradiation process. In Comparative Example 2, the wafer was processed in the same manner as Example 1, except that the ultraviolet irradiation process was not performed.

In each of Example 1 and Comparative Examples 1 and 2, a wet etching process was performed using 0.5% dilute hydrofluoric acid, and an etching amount (etching rate) per unit time was evaluated. Further, a relative etching rate was obtained in each of the examples, given that an etching rate of a thermal oxide film of silicon using 0.5% dilute hydrofluoric acid was set to be 1. In the following examples, an etching resistance was evaluated based on the relative etching rate.

The relative etching rates in Comparative Examples 1 and 2 were 3.74 and 5.55, respectively. On the other hand, the relative etching rate in Example 1 was 2.04.

According to this result, when applying the coating liquid containing polysilazane to the wafer W to form an insulating film, it is possible to enhance the etching resistance by irradiating the coating film with the energy of ultraviolet rays in the $N_2$ gas atmosphere before the curing process.

Furthermore, in each of Example 1 and Comparative Example 1, the amount of atomic bonds before and after the ultraviolet irradiation process and after the curing process were evaluated using a Fourier transform infrared spectrophotometer (FT-IR). In Comparative Example 1, the Si—H bonds were decreased and the Si—O bonds were increased after the ultraviolet ray irradiation process. In Example 1, a decrease in Si—H bonds was observed but the Si—O bonds were not increased after the ultraviolet ray irradiation process, and the Si—O bonds were increased after the curing process.

According to this result, it is presumed that, although the Si—H bonds may be reduced and dangling bonds may be formed by performing the ultraviolet rat irradiation process, the crosslinking reaction may proceed prior to the curing process when the ultraviolet ray irradiation process is performed in atmospheric atmosphere, whereas the crosslinking reaction before the curing process may be suppressed when the ultraviolet ray irradiation process is performed in a $N_2$ gas atmosphere. It is also presumed that the etching resistance is enhanced by forming the dangling bonds and suppressing the crosslinking reaction before the curing process.

In the cases where the dose of ultraviolet rays is set to 3,000 and 4,000 mJ/cm$^2$, the relative etching rates were evaluated to be 2.70 and 2.42, respectively, and even at the dose of ultraviolet rays of about 4,000 mJ/cm$^2$, it was possible to obtain an insulating film having a high etching resistance.

<Evaluation Test 2>

In order to verify the effect of performing the curing process after the application of the coating liquid to the wafer W and the ultraviolet ray irradiation process on the coating film are repeated a plurality of times, insulating films were formed on wafers W using the substrate processing system illustrated in FIG. 17 according to the following examples, and relative etching rates were obtained in the same manner as in Example 1 to evaluate the insulating films in terms of etching resistance.

[Example 2-1]

After a first application of the coating liquid was performed on a test wafer W, the wafer W was heated at 150 degrees C. for three minutes in the solvent volatilization process, and then the ultraviolet ray irradiation process as in the embodiment was performed without performing the reflow process. In the ultraviolet ray irradiation process, the dose amount of ultraviolet rays having a wavelength of 172 nm irradiated in a $N_2$ gas atmosphere was set to 4,000 mJ/cm$^2$. As a second application of the coating liquid, after applying the same amount of coating liquid as that in the first application, the wafer W was heated at 150 degrees C. for three minutes in the solvent volatilization process, and then the ultraviolet ray irradiation process as in the embodiment was performed without performing the reflow process. Thereafter, the same curing process as in Example 1 was performed. The example as described above was taken as Example 2-1. The amount of the coating liquid supplied in the first application and the amount of the coating liquid supplied in the second application coating were approximately the same as in Example 1, and a target film thickness of the coating film after the curing process was set to 200 nm.

[Example 2-2]

In Example 2-2, the wafer W was processed in the same manner as Example 1, except that the film formation was performed by setting the applied amount of the coating liquid to be approximately twice that in Example 1, a target film thickness of the coating film was set to 200 nm, and the dose amount of the ultraviolet rays having a wavelength of 172 nm irradiated in a $N_2$ gas atmosphere in the ultraviolet irradiation process was set to be 4,000 mJ/cm$^2$.

The relative etching rates in Examples 2-1 and 2-2 were 2.27 and 2.56, respectively. It can be seen that, in either of Examples 2-1 and 2-2, the relative etching rate was low and the etching resistance was high. In addition, it can be seen that the relative etching rate was further lowered in Example 2-1 compared with Example 2-2.

According to this result, it can be said that it is possible to obtain a denser insulating film having a good film quality by repeating the application of the coating liquid to a wafer W and the ultraviolet ray irradiation process to the coating film a plurality of times.

<Evaluation Test 3>

In order to verify the effect obtained by a heating temperature of the wafer W in the solvent volatilization process, an insulating film was formed on the wafer W using the substrate processing system illustrated in FIG. 17, and an etching resistance of the insulating film was evaluated.

[Example 3-1]

After applying the coating liquid described in the embodiment, the wafer W was heated at 150 degrees C. for three minutes in the solvent volatilization process, and then the ultraviolet ray irradiation process was performed without performing the reflow process. In the subsequent curing process, in a state where water vapor was supplied to a heat treatment furnace, the wafer W was heated in two stages, i.e., at 400 degrees C. for thirty minutes and 450 degrees C. for 120 minutes, and then the wafer W was heated at 450 degrees C. for thirty minutes under a $N_2$ gas atmosphere. In addition, a target film thickness of the coating film was set to be 100 nm.

[Examples 3-2 and 3-3]

In each of Examples 3-2 and 3-3, the wafer W were processed in the same manner as in Example 3-1, except that the heating temperatures of the wafer W in the solvent volatilization process was set to 200 degrees C. and 250 degrees C., respectively.

The relative etching rates in Examples 3-1, 3-2, and 3-3 were 3.68, 2.74, and 2.74, respectively. It can be said that it is possible to obtain a denser and better insulating film by increasing the heating temperature of the wafer W in the solvent volatilization process.

EXPLANATION OF REFERENCE NUMERALS

2: coating module, 3: solvent volatilization module, 4: reflow module, 5: ultraviolet ray irradiation module, 6: curing module, 9, 90, 92: controller, 99: upper-level computer, 100: silicon film, 101: coating film, W: wafer

What is claimed is:

1. An insulating film forming method comprising:
a process of forming a coating film by applying a coating liquid, which is obtained by dissolving precursors for forming a silicon-oxide-containing insulating film, to a substrate, molecular groups of each of the precursors being a group of oligomers;
a solvent volatilization process of volatilizing a solvent in the coating film;
subsequently, a reflow process of heating the substrate such that the group of oligomers in the coating film are rearranged;
subsequently, an energy supply process of supplying an energy to the coating film under a low oxygen atmosphere having an oxygen concentration lower than that of atmospheric atmosphere, such that dangling bonds are formed in the molecular groups; and
subsequently, a curing process of heating the substrate such that the precursors are crosslinked to form the insulating film,
wherein the energy supply process is performed at a first predetermined temperature and the curing process is performed at a second predetermined temperature higher than the first predetermined temperature,
wherein the solvent volatilization process is performed at a third predetermined temperature different from the first predetermined temperature, and
wherein in the curing process, the substrate is heated under a water vapor atmosphere.

2. The insulating film forming method of claim 1, wherein the energy supply process is performed after the reflow process in a state where a temperature of the substrate is decreased.

3. The insulating film forming method of claim 1, wherein the low oxygen atmosphere in which the energy supply process is performed has an oxygen concentration of 400 ppm or less.

4. The insulating film forming method of claim 1, wherein the low oxygen atmosphere is an atmosphere containing an inert gas.

5. The insulating film forming method of claim 1, wherein the energy is an energy of ultraviolet rays having a main wavelength that is shorter than 200 nm.

6. The insulating film forming method of claim 5, wherein the energy of the ultraviolet rays supplied to the coating film is an energy of 5,000 $mJ/cm^2$ or less.

7. The insulating film forming method of claim 1, wherein the process of forming the coating film, the solvent volatilization process, and the energy supply process are repeated a plurality of times, and then the curing process is performed.

8. The insulating film forming method of claim 1, wherein the second predetermined temperature ranges from 350 degrees C. to 450 degrees C.

9. An insulating film forming device comprising:
a coating module configured to form a coating film by applying a coating liquid, which is obtained by dissolving precursors for forming a silicon-oxide-containing insulating film, to a substrate, molecular groups of each of the precursors being a group of oligomers;
a solvent volatilization module configured to volatilize a solvent in the coating film;
a reflow module configured to heat the substrate such that the group of oligomers in the coating film are rearranged;
an energy supply module configured to supply an energy to the coating film at a first predetermined temperature, from which the solvent has been volatilized, under a low oxygen atmosphere having an oxygen concentration lower than that of atmospheric atmosphere, such that the precursors are activated;
a curing module configured to heat the substrate at a second predetermined temperature which is higher than the first predetermined temperature after being processed in the energy supply module such that the precursors are crosslinked to form the insulating film; and
a substrate transfer mechanism configured to transfer the substrate among the respective modules,
wherein the solvent volatilization module volatilizes the solvent at a third predetermined temperature different from the first predetermined temperature, and
wherein in the curing module, the substrate is heated under a water vapor atmosphere.

10. The insulating film forming device of claim 9, wherein the solvent volatilization module is a solvent heating module configured to heat the substrate.

11. The insulating film forming device of claim 9, wherein the energy supply module is a module configured to irradiate the coating film with ultraviolet rays having a main wavelength that is shorter than 200 nm.

12. The insulating film forming device of claim 9, wherein the curing module is configured to heat the substrate by supplying a vapor to the substrate.

13. A substrate processing system comprising:
a substrate processing device comprising: a loading and unloading port through which a substrate accommodated in a transfer container is loaded and unloaded; a coating module configured to form a coating film by applying a coating liquid, which is obtained by dissolving precursors for forming a silicon-oxide-containing insulating film, to a substrate, molecular groups of each of the precursors being a group of oligomers; a solvent volatilization module configured to volatilize a solvent in the coating film; a reflow module configured to heat the substrate such that the group of oligomers in the coating film are rearranged; an energy supply module configured to supply an energy to the coating film at a first predetermined temperature, from which the solvent has been volatilized, under a low oxygen atmosphere having an oxygen concentration lower than that of atmospheric atmosphere, such that the precursors are activated; and a substrate transfer mechanism configured to transfer the substrate among the respective modules and the loading and unloading port;

a curing device configured to heat the substrate at a second predetermined temperature which is higher than the first predetermined temperature after being processed in the energy supply module such that the precursors are crosslinked to form the insulating film; and a container transfer mechanism configured to transfer the transfer container between the loading and unloading port of the substrate processing device and the curing device, wherein the solvent volatilization module volatilizes the solvent at a third predetermined temperature different from the first predetermined temperature, and wherein in the curing device, the substrate is heated under a water vapor atmosphere.

14. The insulating film forming method of claim 1, wherein the first predetermined temperature is room temperature.

* * * * *